(12) United States Patent
Ebina

(10) Patent No.: US 6,504,213 B1
(45) Date of Patent: Jan. 7, 2003

(54) SOI-STRUCTURE FIELD-EFFECT TRANSISTOR AND METHOD OF MANUFACTURING THE SAME

(75) Inventor: Akihiko Ebina, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 26 days.

(21) Appl. No.: 09/626,606

(22) Filed: Jul. 27, 2000

(30) Foreign Application Priority Data

Jul. 27, 1999 (JP) .......................................... 11-212019

(51) Int. Cl.[7] .............................................. H01L 27/01
(52) U.S. Cl. ...................... 257/347; 257/348; 257/350; 257/360
(58) Field of Search ................................ 257/347, 240, 257/348, 368, 396

(56) References Cited

U.S. PATENT DOCUMENTS

| | | | | | |
|---|---|---|---|---|---|
| 4,809,056 | A | * | 2/1989 | Shirato et al. ................. | 357/71 |
| 5,428,237 | A | * | 6/1995 | Yuzurihara et al. .......... | 257/349 |
| 6,300,657 | B1 | * | 10/2001 | Bryant et al. ................. | 257/318 |

\* cited by examiner

*Primary Examiner*—David Nelms
*Assistant Examiner*—Thao P Le
(74) *Attorney, Agent, or Firm*—Hogan & Hartson, LLP

(57) ABSTRACT

A dynamic threshold-voltage MOSFET (DTMOS) enables a low power consumption, even during use under conditions of a comparatively high gate voltage. A first contact portion and a gate electrode are placed in electrical contact by a resistance portion. A part of an interconnecting portion is utilized as the resistance portion, by making the width of the part of the interconnecting portion smaller than the width of a remaining part of the interconnecting portion. The forward-direction current flowing through a PN junction formed by a body region and a source region is limited by the resistance portion, even when a comparatively high voltage is applied to the gate electrode. Thus the current between the body region and the source region can be held low. As a result, the power consumption can be reduced, even when the MOS field-effect transistor is used under conditions of a comparatively high gate voltage.

30 Claims, 34 Drawing Sheets

SOI-STRUCTURE FIELD-EFFECT TRANSISTOR AND METHOD OF MANUFACTURING THE SAME

BACKGROUND OF THE INVENTION

The present invention relates to a field-effect transistor of a silicon-on-insulator (SOI) structure, and a method of manufacture thereof.

A SOI-structure MOS field-effect transistor can be driven at a lower power consumption and a higher speed than an ordinary MOS field-effect transistor.

A schematic view of an example of a SOI-structure MOS field-effect transistor is shown in FIG. 50. A buried oxide film 1100 formed by a silicon oxide layer is formed on a silicon substrate 1000. A source region 1200 and a drain region 1300 are provided in mutually separate locations on the buried oxide film 1100. A body region 1400 is formed on the buried oxide film 1100, between the source region 1200 and the drain region 1300. A gate electrode 1500 is formed on the body region 1400 with a gate insulation film therebetween.

The body region 1400 of the MOS field-effect transistor of FIG. 50 is in a floating state. Thus carriers generated by impact ionization tend to accumulate in the body region 1400. When carriers accumulate, the potential of the body region 1400 changes. This phenomenon is called the substrate floating effect. This causes various problems in the MOS field-effect transistor, such as the kink phenomenon and the parasitic bipolar effect.

A SOI-structure MOS field-effect transistor can suppress this substrate floating effect. A schematic view of such a MOS field-effect transistor is shown in FIG. 51. This MOS field-effect transistor is called a dynamic threshold-voltage MOSFET (DTMOS). It differs from the MOS field-effect transistor shown in FIG. 50 in that the body region 1400 and the gate electrode 1500 are placed in electrical contact. This connection makes it possible for excess carriers that have accumulated within the body region 1400 to be drawn out of the body region 1400. This stabilizes the potential of the body region, making it possible to prevent the occurrence of the substrate floating effect.

However, a DTMOS has another problem in that it can only be used in practice under low gate voltage conditions of a gate voltage on the order of 1 V or less. In other words, a voltage that is applied to the body region in a DTMOS is of the same magnitude as the voltage applied to the gate electrode thereof. The application of a voltage to the body region causes a forward bias voltage to be applied to the PN junction formed by the body region and the source region. Since the withstand voltage in the forward direction of a PN junction is usually on the order of 0.7 V, any increase in the gate voltage beyond that point will cause a large current to flow between the body region and the source region. This current will make it impossible to achieve the lower power consumption that is the objective of a SOI structure. Such a current would cause errors in the operation of the circuitry comprising the SOI structure. In addition, since a small forward-direction current flows between the body region and the source region, even when the DTMOS is used at a gate voltage of less than 0.7 V, this impedes any reduction in the power consumption.

SUMMARY OF THE INVENTION

An objective of the present invention is to provide a SOI-structure field-effect transistor and a method of manufacture thereof that make it possible to achieve a lower power consumption, even during use under conditions of a comparatively high gate voltage.

(1) One aspect of the present invention relates to a MOS field-effect transistor formed on a SOI substrate, the SOI-structure field-effect transistor comprising a source region, a drain region, a body region, a gate electrode, a gate insulation film, a first contact portion, a second contact portion, and a resistance portion. The body region is interposed between the source region and the drain region and includes a first end portion and a second end portion. The gate electrode is formed on the body region, with the gate insulation film interposing therebetween, and extends in a direction from the first end portion toward the second end portion. The first contact portion is formed on the first end portion side. The a gate signal interconnecting for transferring a gate signal that is to be input to the gate electrode is connected electrically to the gate electrode within the first contact portion. The second contact portion is formed on the second end portion side. The gate electrode is connected electrically to the body region in the second contact portion. The resistance portion is formed on the first end portion side. The gate electrode is connected electrically to the first contact portion through the resistance portion.

In a DTMOS, the body region and the gate electrode are placed in electrical contact. The body region and the source region form a PN junction. For that reason, when a positive voltage is applied to the gate electrode of an nMOS transistor, by way of example, this causes a forward-direction voltage to be applied to this PN junction. When a voltage that is greater than the forward-direction withstand voltage of this PN junction is applied between the gate electrode and the source region, this will cause a current to flow between the gate electrode and the source region. When the gate voltage increases, this current will also increase. Thus the power consumption of the DTMOS will increase when it is used under conditions of a comparatively high gate voltage.

In the SOI-structure MOS field-effect transistor in accordance with this aspect of the present invention, the gate electrode and the first contact portion are placed into electrical contact by the resistance portion. The forward-direction current that flows through the PN junction as described above is therefore restricted by this resistance portion, making it possible to reduce the current between the body region and the source region. As a result, the power consumption of the DTMOS may be reduced, even when the DTMOS is being used under conditions of a comparatively high gate voltage.

In addition, the first contact portion of the SOI-structure MOS field-effect transistor in accordance with the present invention, the first contact portion thereof is formed on a first end portion side and the second contact portion thereof is formed on a second end portion side. This aspect of the present invention makes it possible for the gate electrode itself to function as a resistor, because a current flows through the gate electrode.

Note that the SOI-structure MOS field-effect transistor in accordance with this aspect of the present invention may have the effect of reducing the power consumption, regardless of whether the field-effect transistor is partially depleted or fully depleted. This will be discussed in the Experimental Examples part of the Description of Preferred Embodiments.

A method of manufacturing a SOI-structure MOS field-effect transistor in accordance with another aspect of the present invention comprises following steps:

(a) forming a body region having a first end portion and a second end portion, on the SOI substrate;

(b) forming a gate electrode on the body region, extending from the first end portion towards the second end portion;

(c) using the gate electrode as a mask for implanting ions into the SOI substrate, to form a source region and a drain region, in such a manner that the body region is interposed therebetween;

(d) forming a first contact portion on the first end portion side, through which the gate electrode is electrically connected to a gate signal interconnecting for transferring gate signals to be input to the gate electrode, and a second contact portion on the second end portion side, through which the gate electrode is electrically connected to the body region; and (e) forming a resistance portion on the first end portion side, for providing electrical contact between the gate electrode and the first contact portion, in the steps (b) to (d).

(2) The SOI-structure MOS field-effect transistor may be provided with an interconnecting portion described below. The resistance portion may be comprised within an interconnecting portion. The interconnecting portion may be formed on the first end portion side, and may electrically connect the gate electrode and the first contact portion. A part of the interconnecting portion may be utilized as the resistance portion, by making the width of the part of the interconnecting portion smaller than the width of a remaining part of the interconnecting portion.

The SOI-structure MOS field-effect transistor may control the resistance of the resistance portion by a suitable combination of the width of the part of the interconnecting portion and the length of the part of the interconnecting portion. In other words, when the width W is made large, the resistance will be small; when the width W is made small, the resistance will be large. When the length L is made large, the resistance will be large; when the length L is made small, the resistance will be small.

The SOI-structure MOS field-effect transistor may be manufactured by the following step:

Step (e) may further comprise a step of forming an interconnecting portion for providing electrical contact between the gate electrode and the first contact portion. The step of forming the interconnecting portion may be patterning of the interconnecting portion such as to reduce the width of a part of the interconnecting portion to smaller than the width of a remaining part of the interconnecting portion.

(3) The SOI-structure MOS field-effect transistor may be provided with an interconnecting portion described below. The resistance portion may be comprised within an interconnecting portion. The interconnecting portion may comprise a polysilicon film. The interconnecting portion may be formed on the first end portion side, and may electrically connect the gate electrode and the first contact portion. A part of the interconnecting portion may be utilized as the resistance portion, by making the impurity concentration of the part of the interconnecting layer lower than the impurity concentration of a remaining part of the interconnecting layer.

In the SOI-structure MOS field-effect transistor, the film that will become the interconnecting portion and the film that will become the resistance portion may be formed simultaneously, without increasing the area of the resistance portion.

The SOI-structure MOS field-effect transistor may be manufactured by the following step:

The step (e) may further comprise a step of forming an interconnecting portion including a polysilicon layer, and for providing electrical contact between the gate electrode and the first contact portion. The step of forming the interconnecting portion may be such as to make the impurity concentration of a part of the interconnecting layer lower than the impurity concentration of a remaining part of the interconnecting layer. One method of making the impurity concentration of the part of the interconnecting layer lower than the impurity concentration of the remaining part of the interconnecting layer may be to form a polysilicon film and then cover the part of that film with a mask. Ions may be implanted into that film. Since ions are not implanted into the part of the film, the impurity concentration of that the part of the film may be lower than the impurity concentration of the remaining part of the film.

(4) The SOI-structure MOS field-effect transistor may be provided with an interconnecting portion described below. The resistance portion may be comprised within an interconnecting portion. The interconnecting portion may be formed on the first end portion side, and may electrically connect the gate electrode and the first contact portion. A part of the interconnecting portion may be utilized as the resistance portion, by forming the part of the interconnecting portion from a polysilicon film alone and forming a remaining part of the interconnecting portion from a polysilicon film and a silicide film.

In the SOI-structure MOS field-effect transistor, the film that will become the interconnecting portion and the film that will become the resistance portion may be formed simultaneously, while reducing the resistance of the interconnecting portion.

The SOI-structure MOS field-effect transistor may be manufactured by the following step:

Step (e) may further comprise a step of forming an interconnecting portion for providing electrical contact between the gate electrode and the first contact portion. The step of forming the interconnecting portion may be such that a part of the interconnecting portion is formed of a polysilicon film alone and a remaining part of the interconnecting portion is formed of a polysilicon film and a silicide film. Such a configuration can make it possible to form the interconnecting portion by a method in which the silicide film is removed from the part of the interconnecting portion, or a method in which the silicide film is not formed over the part of the interconnecting layer, by way of example. The method of removing the silicide film from the part of the interconnecting portion may be as described below. The polysilicon film is first formed, then a refractory metal film is formed on the polysilicon film. The refractory metal film is annealed to form a silicide film. The silicide film on the part of the interconnecting portion is removed.

The method of ensuring that the silicide film is not formed on the part of the interconnecting portion is as described below. A polysilicon film is formed. A refractory metal film is then formed on the polysilicon film, at regions other than the region that forms a part of the interconnecting portion. The refractory metal film is annealed to form a silicide film.

(5) The SOI-structure MOS field-effect transistor may be provided with an interconnecting portion described below. The resistance portion may be comprised within an interconnecting portion. The interconnecting portion may be formed on the first end portion side, and may electrically connect the gate electrode and the first contact portion. A part of the interconnecting portion is utilized as the resistance portion by forming, the length of the interconnecting portion may be longer than a shortest distance between the first contact portion and the gate electrode.

This configuration lengthens the interconnecting portion by making the length of the interconnecting portion longer than the shortest distance between the first contact portion and the gate electrode. The entire interconnecting portion is utilized as the resistance portion. This distance could be at least 1 μm, by way of example.

A configuration for ensuring that the length of the interconnecting portion is longer than the shortest distance between the first contact portion and the gate electrode could be as described below, by way of example. An element isolation layer may be disposed in a manner to surround the source region and the drain region. The interconnecting portion may take a circuitous path on a surface of the element isolation layer and is connected electrically to the first contact portion. In this configuration the resistance portion is formed on the element isolation layer, making it possible to efficiently utilize the region on the element isolation layer.

This configuration may be manufactured by the step described below. Step (e) may further comprise a step of forming an interconnecting portion for providing electrical contact between the gate electrode and the first contact portion. The step of forming the interconnecting portion may be patterning of the interconnecting portion such that the interconnecting portion takes a circuitous path and may be connected electrically to the first contact portion, on a surface of an element isolation layer that is disposed in a manner to surround the source region and the drain region.

(6) In the SOI-structure MOS field-effect transistor, the resistance of the resistance portion may be greater than the on-resistance of the field-effect transistor.

The resistance of the resistance portion may be at least ten times the on-resistance of the field-effect transistor. The magnitude of current flowing within the field-effect transistor is the magnitude of the current between the gate electrode and the source region (Igs) added to the magnitude of the current between the drain region and the source region (Ids). When the resistance of the resistance portion is made to be at least ten times the on-resistance of the field-effect transistor, the effects described below may be achieved. In other words, the magnitude of the current between the gate electrode and the source region may be reduced to less than one-tenth, in comparison with the magnitude of the current between the drain region and the source region. Variations on the order of 10% are inevitable in the electrical characteristics of semiconductor device. Thus, even if the magnitude of the current between the gate electrode and the source region is added to the magnitude of the current between the drain region and the source region, the total magnitude will still be within the margin of error for the magnitude of the drain-source current (Ids).

DESCRIPTION OF THE PREFERRED EMBODIMENTS

First Embodiment

Structure

Figure 1:
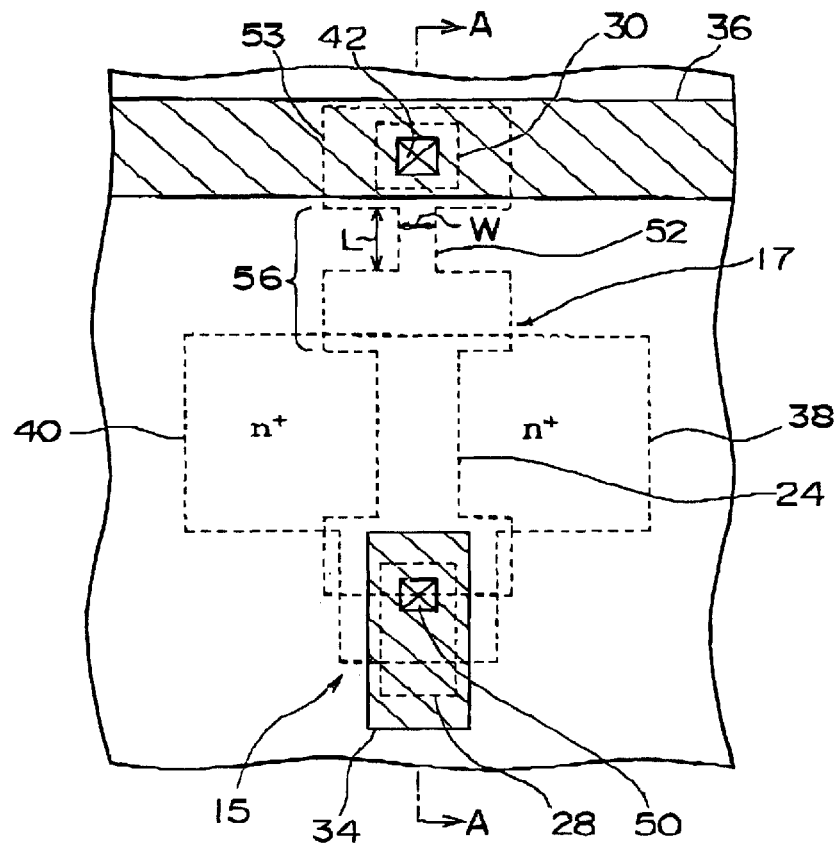
FIG. 1 is a plan view of a SOI-structure MOS field-effect transistor in accordance with a first embodiment of the present invention.
Figure 2:
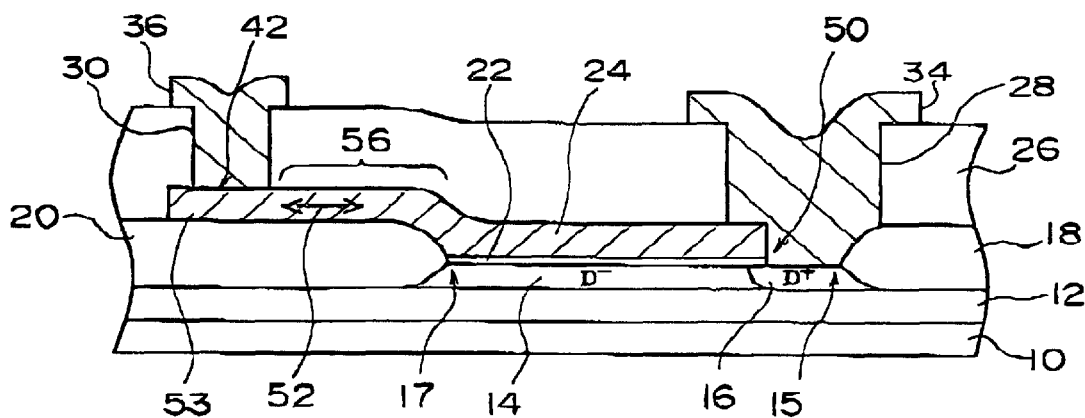
FIG. 2 is a section taken along the line A—A through the structure of the SOI-structure MOS field-effect transistor of FIG. 1.

A plan view of a SOI-structure MOS field-effect transistor in accordance with a first embodiment of the present invention is shown in FIG. 1. A section taken along the line A—A through the structure of the MOS field-effect transistor of FIG. 1 is shown in FIG. 2. In this SOI-structure MOS field-effect transistor, a resistance portion 52 is formed from a part of an interconnecting portion 56, by making the width of the part of the interconnecting portion 56 less than the width of a remaining part of the interconnecting portion 56. The description now turns to the structure of the SOI-structure MOS field-effect transistor, shown in FIG. 2, while referring back to FIG. 1. A SOI substrate comprises a silicon substrate 10, a buried oxide film 12, and a silicon layer. The buried oxide film 12 made of the silicon oxide layer is formed on the silicon substrate 10. The silicon layer is formed on the buried oxide film 12. A body region (a p− region 14 and a p+ region 16) and the like is formed in the silicon layer.

The field oxide films 18 and 20 are formed on the buried oxide film 12 in such a manner that the p− region 14 and the p+ region 16 interpose therebetween. The p− region 14 is disposed in such a manner to interpose between a drain region 38 and a source region 40. A gate oxide film 22 is formed on the p− region 14. A gate electrode 24 is formed on the gate oxide film 22. The gate electrode 24 is placed into electrical contact with a contact pad layer 53 by the interconnecting portion 56. The contact pad layer 53 and the interconnecting portion 56 are positioned on a first end portion 17 side of the body region (the p− region 14 and the p+ region 16), on a field oxide film 20. The width of the part of the interconnecting portion 56 is less than the width of a remaining part of the interconnecting portion 56. This smaller-width portion forms the resistance portion 52. The width W of the resistance portion 52, in FIG. 1, is 0.1 to 0.5 μm, by way of example. The length L of the resistance portion 52 is 1 to 10 μm, by way of example. The gate electrode 24, the interconnecting portion 56, the resistance portion 52, and the contact pad layer 53 are formed simultaneously by patterning of a polysilicon film.

A silicon oxide layer 26 if formed on the SOI substrate in such a manner as to cover the gate electrode 24. Through holes 28 and 30 are formed in the silicon oxide layer 26. The through hole 28 is formed on a second end portion 15 side of the body region. The p+ region 16 is exposed by the through hole 28. An aluminum film 34 fills the through hole 28. The gate electrode 24 and the p+ region 16 are electrically connected by means of the aluminum film 34. The location at which the gate electrode 24 and the p+ region 16 are in electrical contact becomes a second contact portion 50.

The through hole 30 is formed on the first end portion 17 side of the body region (the p− region 14 and the p+ region 16). A gate signal interconnecting 36 is formed on the silicon oxide layer 26. A gate signal that is to be input to the gate electrode 24 is transferred from the gate signal interconnecting 36. The gate signal interconnecting 36 is formed of aluminum. The gate signal interconnecting 36 fills the interior of the through hole 30. The gate signal interconnecting 36 and the gate electrode 24 are placed into electrical contact by the gate signal interconnecting 36 that fills the interior of the through hole 30. The connection portion between the gate signal interconnecting 36 and the aluminum film 34 forms a first contact portion 42. The gate signal is transferred to the gate electrode 24 through the first contact portion 42.

Figure 3:
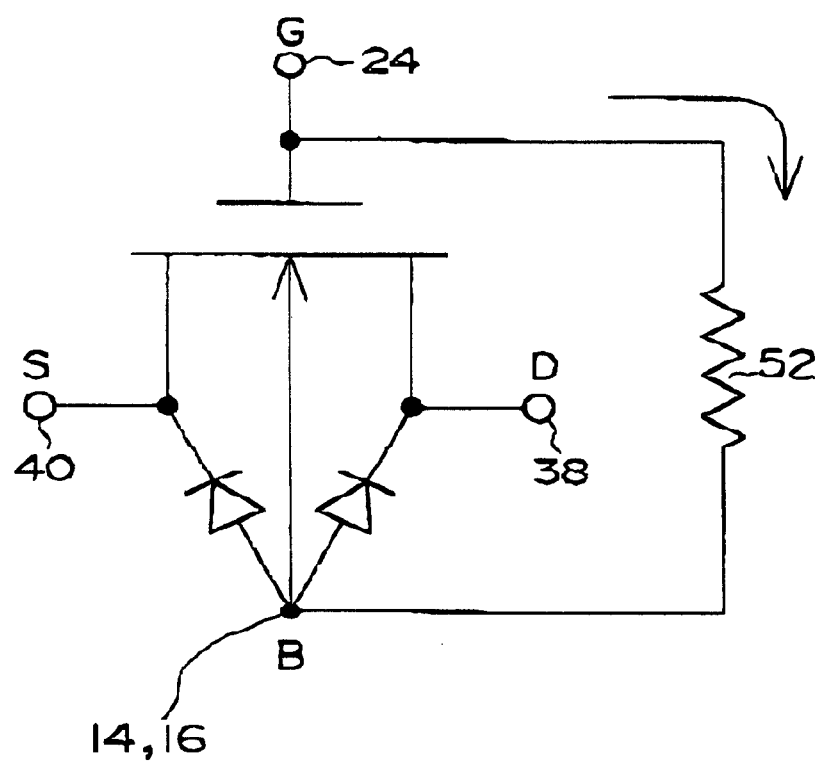
FIG. 3 is an equivalent circuit of the SOI-structure MOS field-effect transistor in accordance with the first embodiment of the present invention.

An equivalent circuit of the SOI-structure MOS field-effect transistor in accordance with the first embodiment of the present invention illustrated in FIGS. 1 and 2 is shown in FIG. 3. Reference numbers 14 and 16 denote the body region (the p− region 14 and the p+ region 16), 24 denotes the gate electrode, 38 denotes the drain region. 40 denotes the source region, and 52 denotes the resistance portion. Note that this embodiment and the embodiments described below all refer to MOS field-effect transistors but the present invention can equally well be applied to other types of field-effect transistor such as MIS field-effect transistors.

Manufacturing Method

Figure 4:
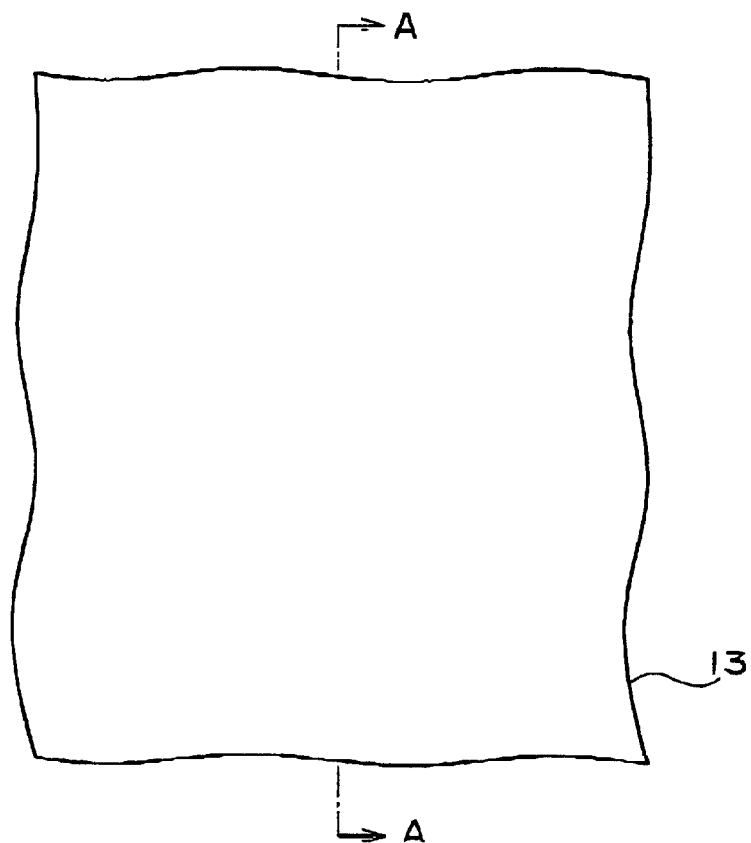
FIG. 4 is a plan view of the SOI substrate, illustrating a first step in the method of manufacturing the SOI-substrate MOS field-effect transistor in accordance with the first embodiment of the present invention.
Figure 5:
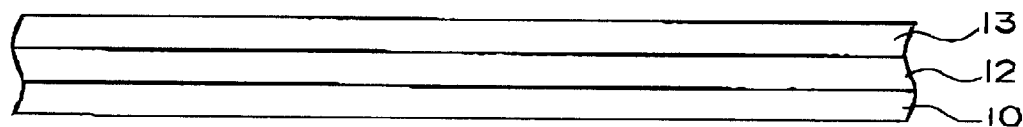
FIG. 5 is a section taken along the line A—A through the structure of the SOI substrate of FIG. 4.

The description now turns to the method of manufacturing the SOI-structure MOS field-effect transistor in accordance with the first embodiment of the present invention. A plan view of the SOI substrate is shown in FIG. 4. FIG. 5 is a section taken along the line A—A through the structure of the SOI substrate of FIG. 4. As shown in FIGS. 4 and 5, the SOI substrate is provided with the silicon substrate 10, the buried oxide film 12 formed on the silicon substrate 10, and a silicon layer 13 formed on the buried oxide film 12.

Figure 6:
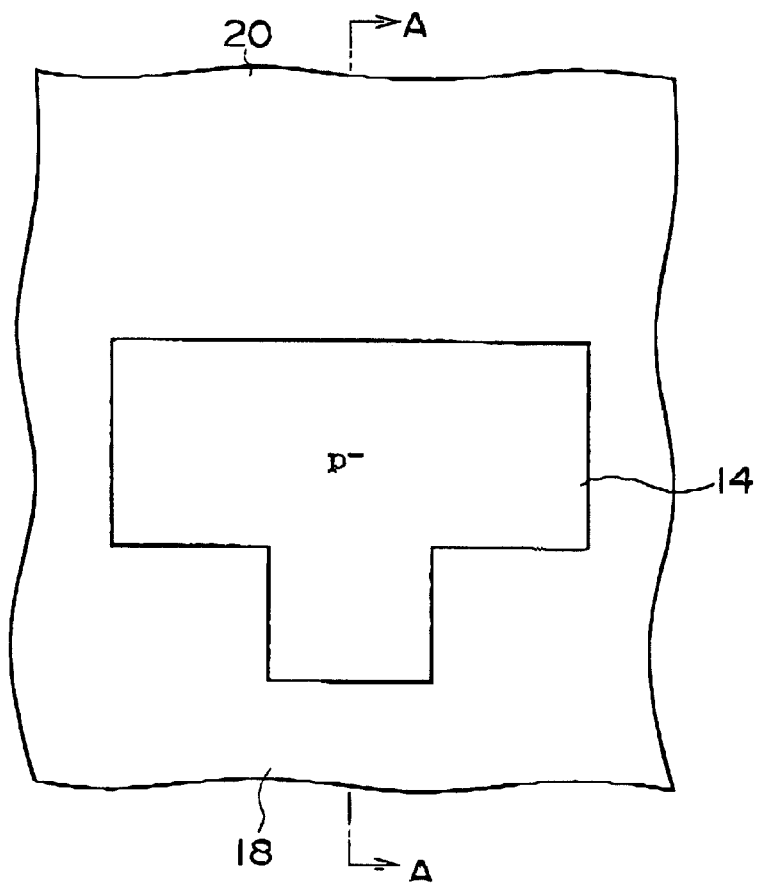
FIG. 6 is a plan view of the SOI substrate, illustrating a second step in the method of manufacturing the SOI-structure MOS field-effect transistor in accordance with the first embodiment of the present invention.
Figure 7:
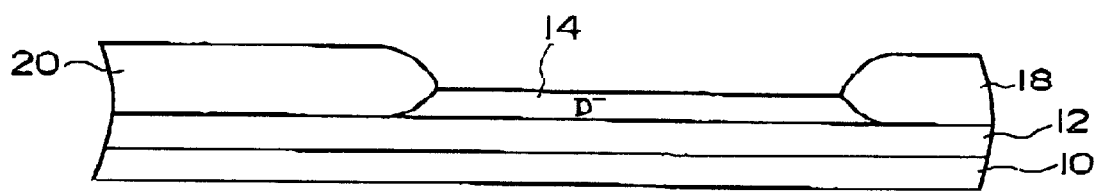
FIG. 7 is a section taken along the line A—A through the structure of the SOI substrate of FIG. 6.

The field oxide films 18 and 20 are formed in the silicon layer 13 by a method such as LOCOS, as shown in FIGS. 6 and 7 (where FIG. 7 is a section taken along the line A—A through the structure of the SOI substrate of FIG. 6). The field oxide films 18 and 20 are formed so as to surround the region in which an nMOS field-effect transistor is to be formed. The field oxide films 18 and 20 are then used as a mask for the implantation of p-type ions into the silicon layer 13, to form the p− region 14 in the region that will form the nMOS field-effect transistor. An element such as boron could be used as the p-type acceptor. The ion implantation energy could be on the order of 20 keV and the dosage could be $6 \times 10^{12}/\text{cm}^2$, by way of example.

Figure 8:
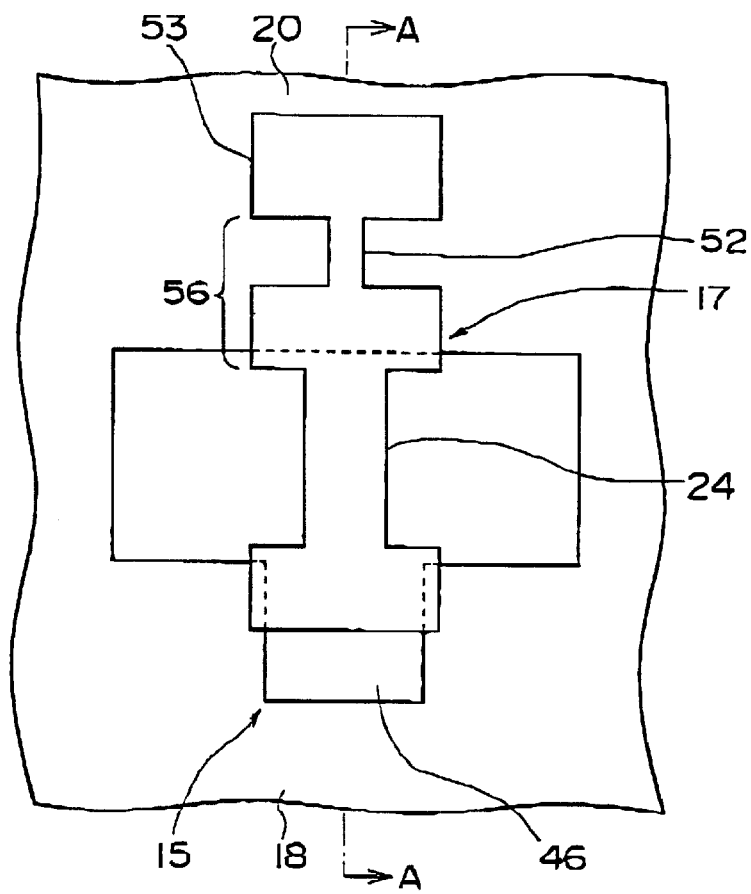
FIG. 8 is a plan view of the SOI substrate, illustrating a third step in the method of manufacturing the SOI-structure MOS field-effect transistor in accordance with the first embodiment of the present invention.
Figure 9:
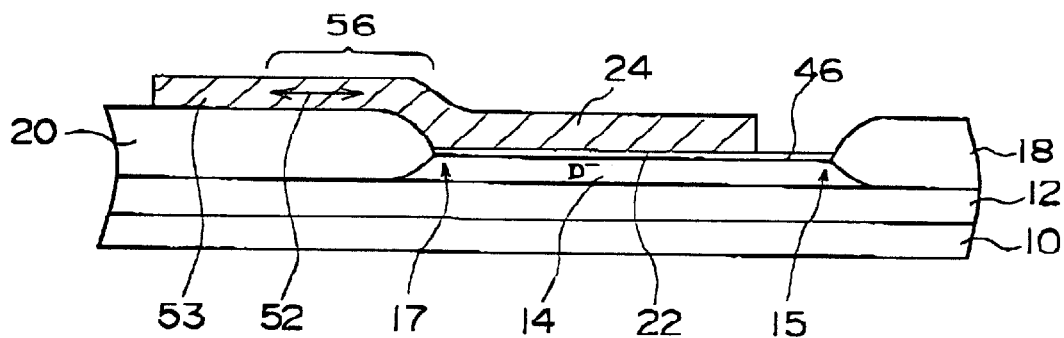
FIG. 9 is a section taken along the line A—A through the structure of the SOI substrate of FIG. 8.

A thin oxide film (of thickness 7 nm) that is to form the gate oxide film is then formed by a method such as thermal oxidation on the p− region 14, as shown in FIGS. 8 and 9 (where FIG. 9 is a section taken along the line A—A through the structure of the SOI substrate of FIG. 8).

A polysilicon film (of thickness 250 nm) that is to form the gate electrode is then formed over the entire surface of the SOI substrate by a method such as CVD.

The polysilicon film is then patterned by photolithography and etching techniques to form the gate electrode 24, the interconnecting portion 56, the resistance portion 52, and the contact pad layer 53. The contact pad layer 53 and the interconnecting portion 56 are positioned on the first end portion 17 side of the body region, on the field oxide film 20. The gate electrode 24 and the interconnecting portion 56 are in electrical contact and the contact pad layer 53 and the interconnecting portion 56 are in electrical contact. The polysilicon film is patterned in such a manner that the width of the part of the interconnecting portion 56 is less than the width of the remaining part of the interconnecting portion 56. This smaller-width portion becomes the resistance portion 52. A region between the gate electrode 24 and the field oxide film 18 becomes a region 46.

Figure 10:
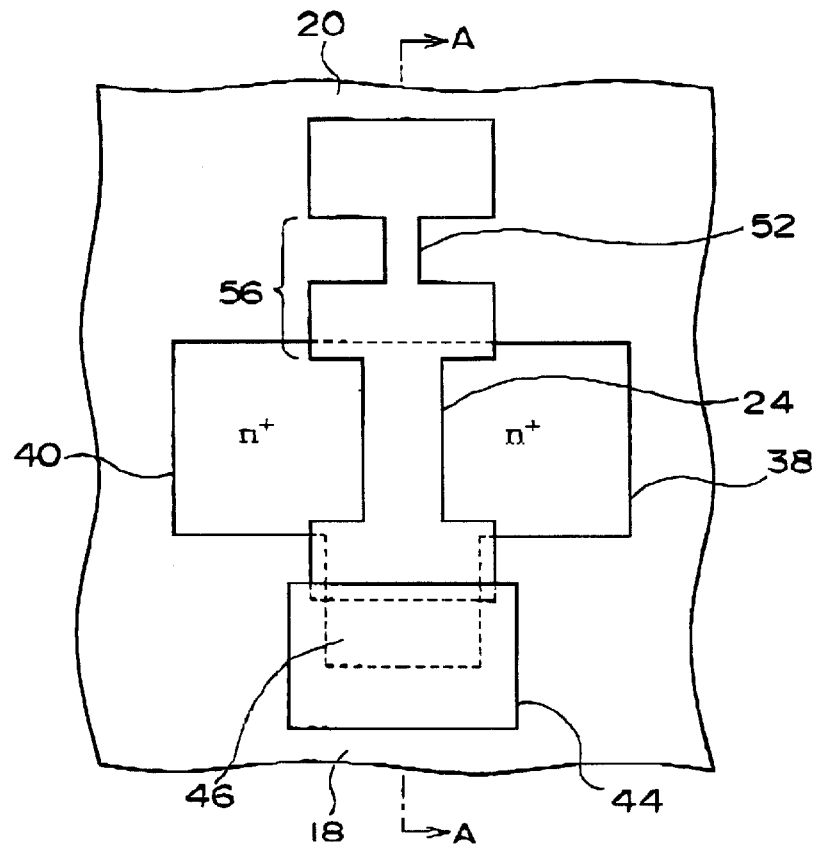
FIG. 10 is a plan view of the SOI substrate, illustrating a fourth step in the method of manufacturing the SOI-substrate MOS field-effect transistor in accordance with the first embodiment of the present invention.
Figure 11:
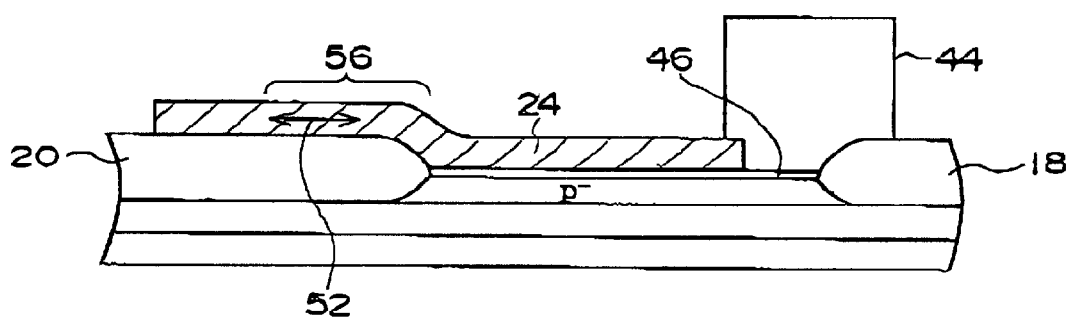
FIG. 11 is a section taken along the line A—A through the structure of the SOI substrate shown in FIG. 10.

A resist layer 44 is formed to cover at least the region 46, as shown in FIGS. 10 and 11 (where FIG. 11 is a section taken along the line A—A through the structure of the SOI substrate of FIG. 10). The resist layer 44 and the field oxide films 18 and 20 are used as a mask for the implantation of n-type ions into the region in which the nMOS field-effect transistor will be formed, to form the source region 40 and the drain region 38. Phosphorous could be used as the n-type ions, the ion implantation energy could be on the order of 40 keV, and the dosage could be $2 \times 10^{15}/\text{cm}^2$, by way of example.

Figure 12:
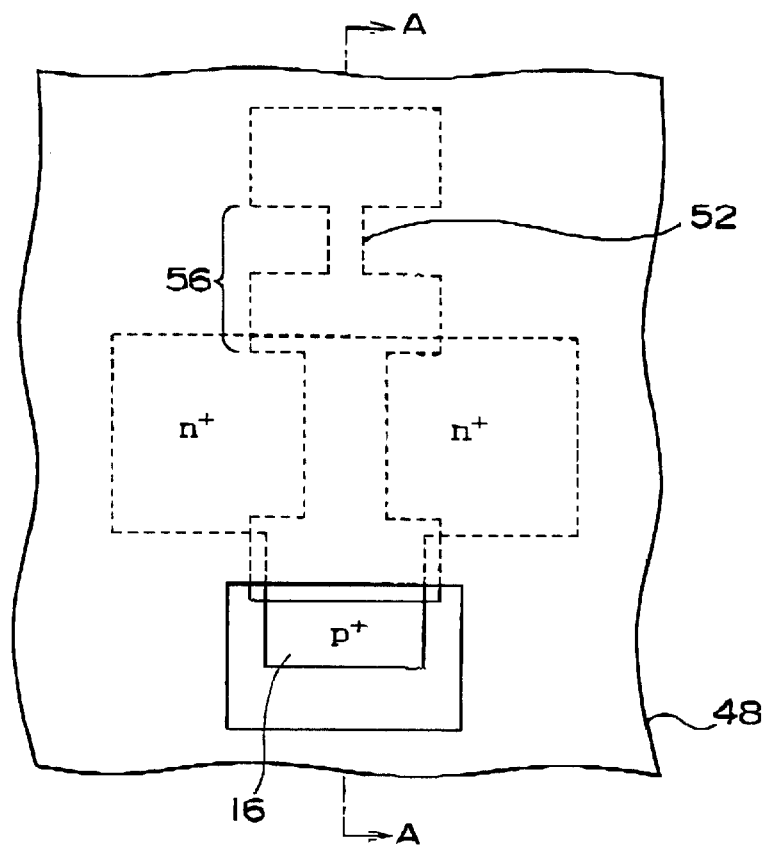
FIG. 12 is a plan view of the SOI substrate, illustrating a fifth step in the method of manufacturing the SOI-substrate MOS field-effect transistor in accordance with the first embodiment of the present invention.
Figure 13:
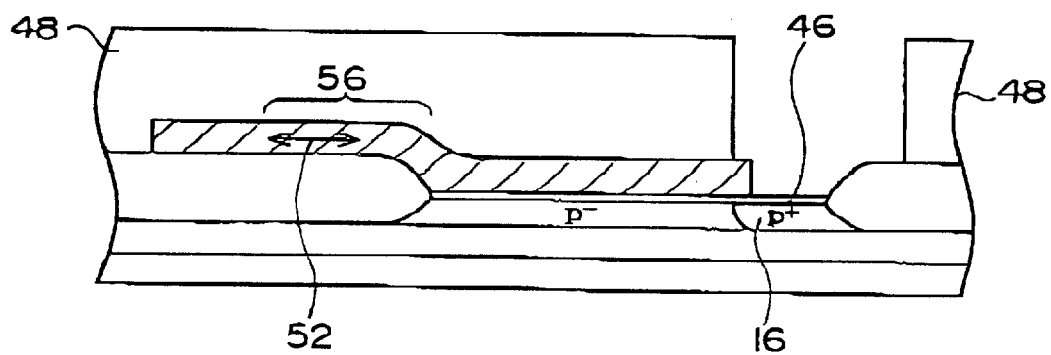
FIG. 13 is a section taken along the line A—A through the structure of the SOI substrate of FIG. 12.

A resist layer 48 is formed to expose at least the region 46, as shown in FIGS. 12 and 13 (where FIG. 13 is a section taken along the line A—A through the structure of the SOI substrate of FIG. 12). The resist layer 48 is used as a mask for the implantation of p-type ions into the region 46, to form the p+ region 16. Boron could be used as the p-type ions, the ion implantation energy could be on the order of 20 keV, and the dosage could be $2 \times 10^{15}/\text{cm}^2$, by way of example.

Figure 14:
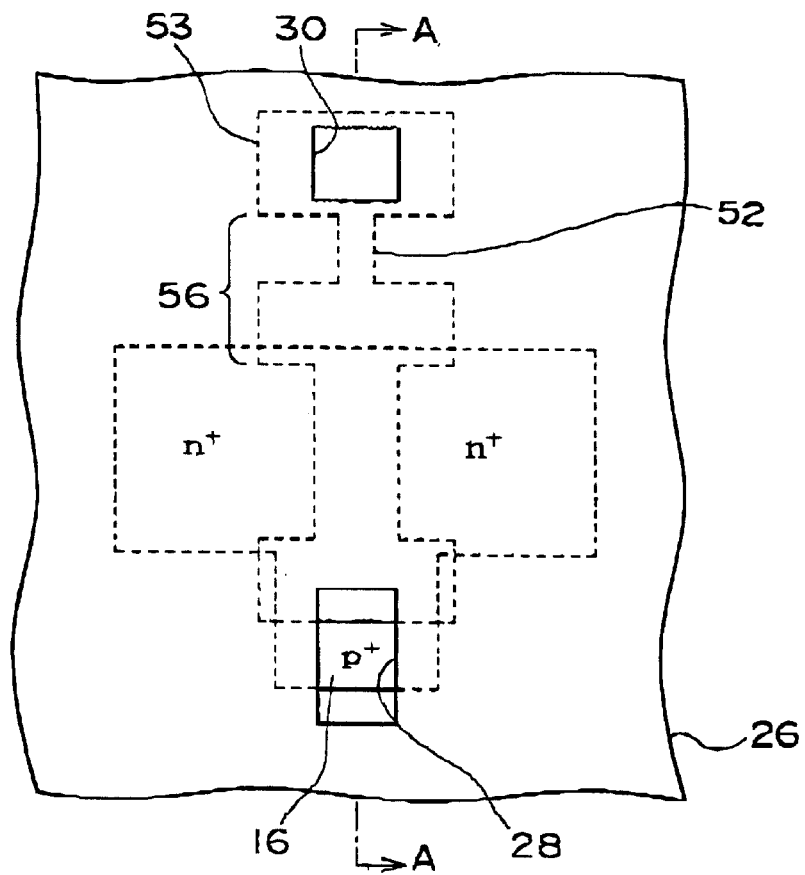
FIG. 14 is a plan view of the SOI substrate, illustrating a sixth step in the method of manufacturing the SOI-structure MOS field-effect transistor in accordance with the first embodiment of the present invention.
Figure 15:
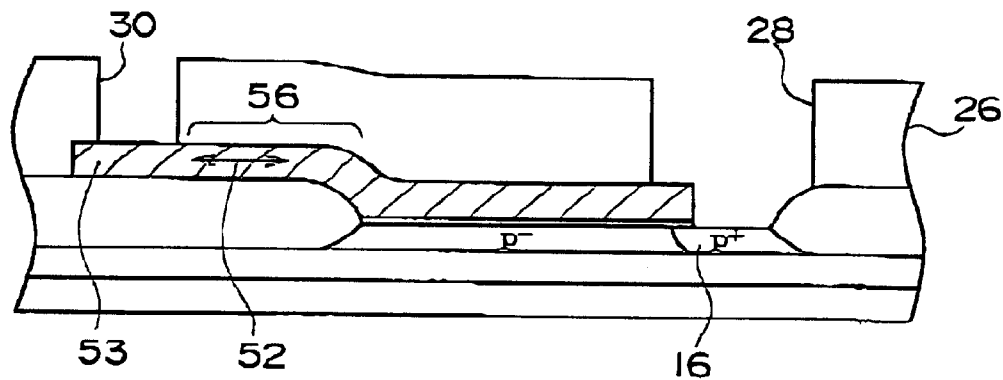
FIG. 15 is a section taken along the line A—A through the structure of the SOI substrate of FIG. 14.

The silicon oxide layer 26 (of thickness 500 nm) is then formed over the entire surface of the SOI substrate by a method such as CVD, as shown in FIGS. 14 and 15 (where FIG. 15 is a section taken along the line A—A through the structure of the SOI substrate of FIG. 14).

The silicon oxide layer 26 is selectively removed by photolithography and etching techniques to form the through hole 28 and the through hole 30. The through hole 28 exposes the p+ region 16 and the through hole 30 exposes the contact pad layer 53.

An aluminum film (of thickness 500 nm) is formed over the entire surface of the SOI substrate by a method such as sputtering, as shown in FIGS. 1 and 2.

The aluminum film is patterned by photolithography and etching techniques to form the aluminum film 34 and the gate signal interconnecting 36, as shown in FIGS. 1 and 2. This completes the SOI-structure MOS field-effect transistor in accordance with the first embodiment of the present invention.

Discussion of Effects (Effect 1)

As shown in FIGS. 1 and 2, the gate electrode 24 and the first contact portion 42 of the SOI-structure MOS field-effect transistor in accordance with the first embodiment of the present invention are placed into electrical contact by the resistance portion 52. The provision of this resistance portion 52 enables the effects described below. When a positive voltage is applied to the gate electrode 24, as shown in FIG. 3, a positive voltage of the same magnitude is also applied to the body region (the p– region 14 and the p+ region 16), through the resistance portion 52. Since the body region is p-type and the source region 40 is n-type, a PN junction is formed by the body region and the source region 40. This ensures that a forward-direction voltage is applied to the PN junction between the body region and the source region 40, by applying a positive voltage to the gate electrode 24 because the source region 40 is at a reference voltage. When there is no resistance portion 52, therefore, a current (Igs) will flow between the gate electrode 24 and the source region 40. This current is a current that does not flow in an ordinary MOS field-effect transistor and is thus undesirable. When a voltage that exceeds the forward-direction withstand voltage of the PN junction is applied between the gate electrode 24 and the source region 40, moreover, the current (Igs) flowing between the gate electrode 24 and the source region 40 will become larger than the current (Ids) flowing between the source region 40 and the drain region 38.

The SOI-structure MOS field-effect transistor in accordance with the first embodiment of the present invention is provided with the resistance portion 52. Thus the forward-direction current flowing through the PN junction is restricted by the resistance portion 52, making it possible to restrain the current between the body region and the source region 40. As a result, it is possible to reduce the power consumption of the SOI-structure MOS field-effect transistor in accordance with the first embodiment, even when the MOS field-effect transistor is used under conditions of a comparatively high gate voltage.

Note that, although the first embodiment was described as relating to an nMOS field-effect transistor, similar effects can be achieved with a PMOS field-effect transistor.

In the SOI-structure MOS field-effect transistor in accordance with the first embodiment of the present invention, the first contact portion 42 is formed on the first end portion 17 side and the second contact portion 50 is formed on the second end portion 15 side. This first embodiment of the invention therefore makes it possible for the gate electrode 24 itself to function as a resistor, because a current flows through this gate electrode 24.

(Effect 2)

In the SOI-structure MOS field-effect transistor in accordance with the first embodiment of the present invention, the part of the interconnecting portion 56 is utilized as the resistance portion 52, by making the width of the part of the interconnecting portion 56 smaller than the width of a remaining part of the interconnecting portion 56, as shown in FIG. 1. Thus the resistance of the resistance portion 52 can be controlled by adjusting the width W of the resistance portion 52 and the length L of the resistance portion 52. In other words, if the width W is made large, the resistance will be small; if the width W is made small, the resistance will be large. If the length L is made large, the resistance will be large; if the length L is made small, the resistance will be small.

Second Embodiment

Structure

Figure 16:
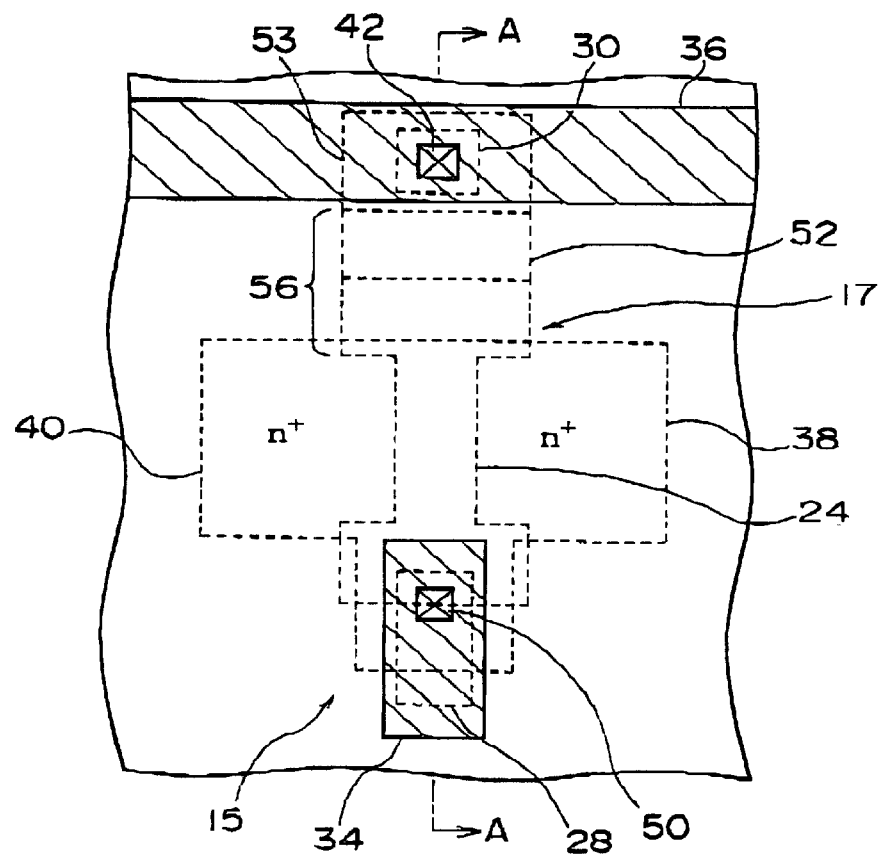
FIG. 16 shows a plan view of a SOI-structure MOS field-effect transistor in accordance with a second embodiment of the present invention.
Figure 17:
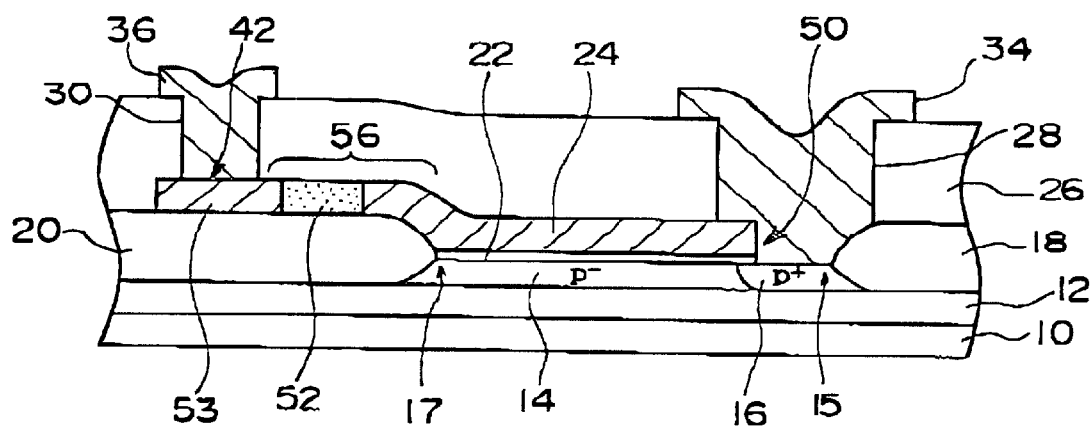
FIG. 17 is a section taken along the line A—A through the SOI-structure MOS field-effect transistor of FIG. 16.

A plan view of a SOI-structure MOS field-effect transistor in accordance with a second embodiment of the present invention is shown in FIG. 16. A section taken along the line A—A through the SOI-structure MOS field-effect transistor of FIG. 16 is shown in FIG. 17. This transistor differs from the SOI-structure MOS field-effect transistor of the first embodiment, shown in FIGS. 1 and 2, in the configuration of the resistance portion 52. In other words, in this second embodiment of the invention, a part of the interconnecting portion 56 is utilized as the resistance portion 52, by making the impurity concentration in the part of the interconnecting portion 56 lower than the impurity concentration in a remaining part of the interconnecting portion 56. In this description of the SOI-structure MOS field-effect transistor in accordance with the second embodiment of the present invention, structural components that are the same as those of the SOI-structure MOS field-effect transistor of the first embodiment, shown in FIGS. 1 and 2, are denoted by the same reference numbers and further description thereof is omitted.

Manufacturing Method

Figure 18:
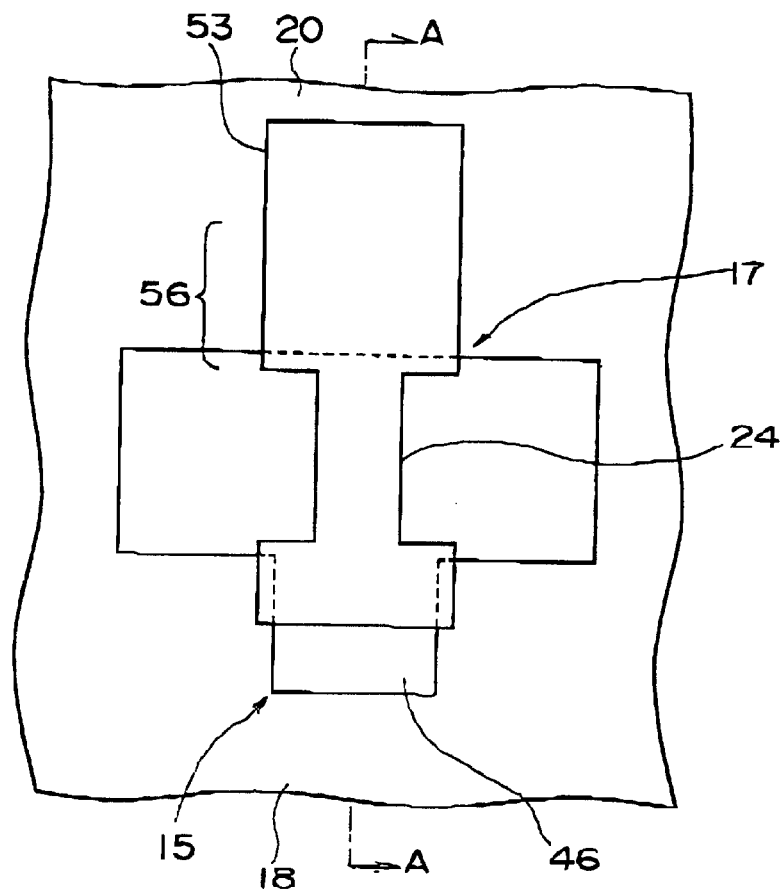
FIG. 18 is a plan view of the SOI substrate, illustrating a first step in the method of manufacturing the SOI-structure MOS field-effect transistor in accordance with the second embodiment of the present invention.
Figure 19:
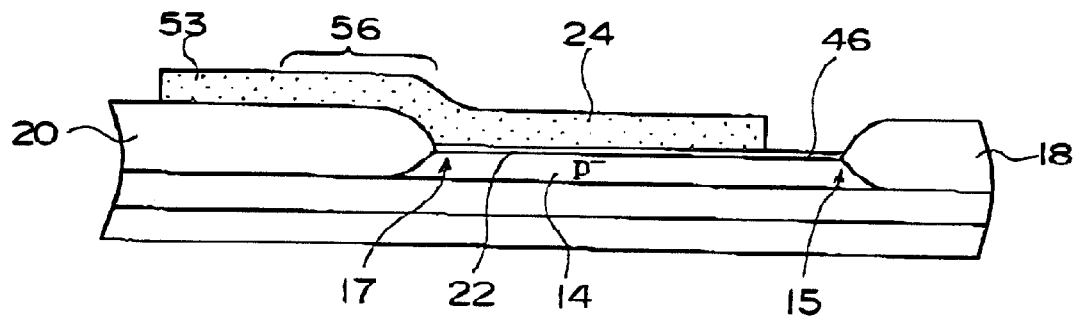
FIG. 19 a section taken along the line A—A through the structure of the SOI substrate of FIG. 18.

The steps shown in FIG. 4 (FIG. 5) and FIG. 6 (FIG. 7) are first performed. The steps up to this point in the method of manufacturing a SOI-structure MOS field-effect transistor in accordance with the second embodiment are the same as the steps in the method of manufacturing the SOI-structure MOS field-effect transistor in accordance with the first embodiment. After the step shown in FIG. 6 (FIG. 7), a thin oxide film that is to form the gate oxide film is formed on the p- region 14, as shown in FIG. 18 and FIG. 19 (where FIG. 19 is a section taken along the line A—A through the structure of the SOI substrate of FIG. 18). The method and conditions of manufacture can be the same as those used for manufacturing the first embodiment of the present invention. A non-doped polysilicon film (of thickness 200 to 500 nm) that is to become the gate electrode is formed over the entire surface of the SOI substrate by a method such as CVD. The formation conditions could be as specified below, by way of example:

Temperature: 580 to 620° C.

Time: 10 to 30 minutes

The polysilicon film is then patterned by photolithography and etching techniques to form the gate electrode 24, the interconnecting portion 56, and the contact pad layer 53. The contact pad layer 53 and the interconnecting portion 56 are positioned on the first end portion 17 side of the body region, on the field oxide film 20. The gate electrode 24 and the interconnecting portion 56 are in electrical contact and the contact pad layer 53 and the interconnecting portion 56 are in electrical contact. The region between the gate electrode 24 and the field oxide film 18 becomes the region 46.

Figure 20:
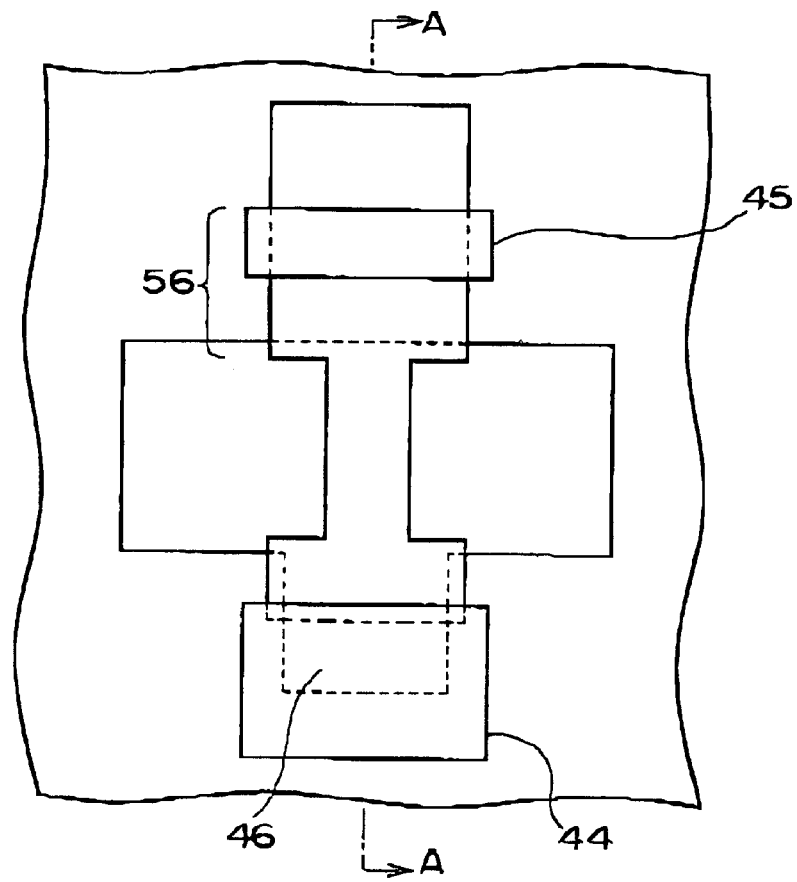
FIG. 20 is a plan view of the SOI substrate, illustrating a second step in the method of manufacturing the SOI-structure MOS field-effect transistor in accordance with the second embodiment of the present invention.
Figure 21:
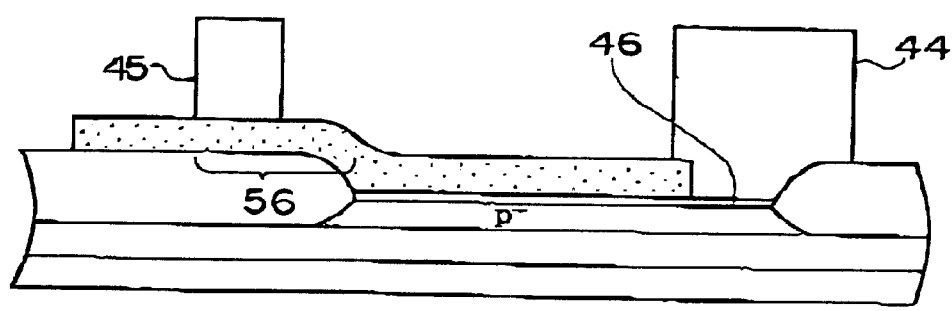
FIG. 21 is a section taken along the line A—A through the structure of the SOI substrate of FIG. 20.

The resist layer 44 is formed to cover the region 46 and another resist layer 45 is formed to cover the part of the interconnecting portion 56, as shown in FIG. 20 and FIG. 21 (where FIG. 21 is a section taken along the line A—A through the structure of the SOI substrate of FIG. 20).

Figure 22:
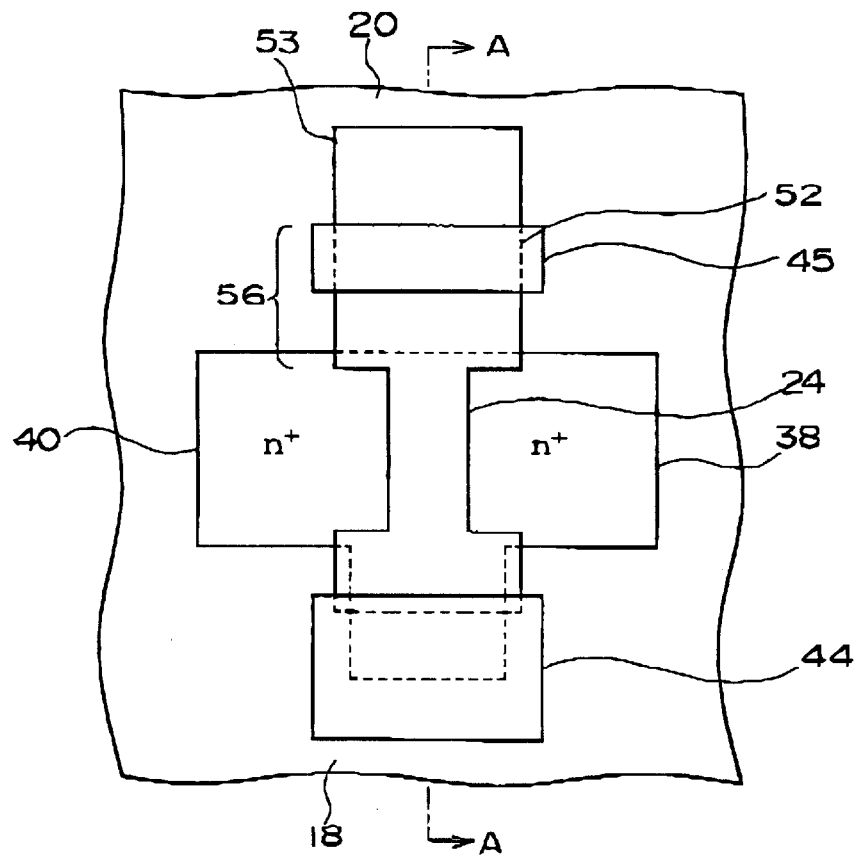
FIG. 22 is a plan view of the SOI substrate, illustrating a third step in the method of manufacturing the SOI-substrate MOS field-effect transistor in accordance with the second embodiment of the present invention.
Figure 23:
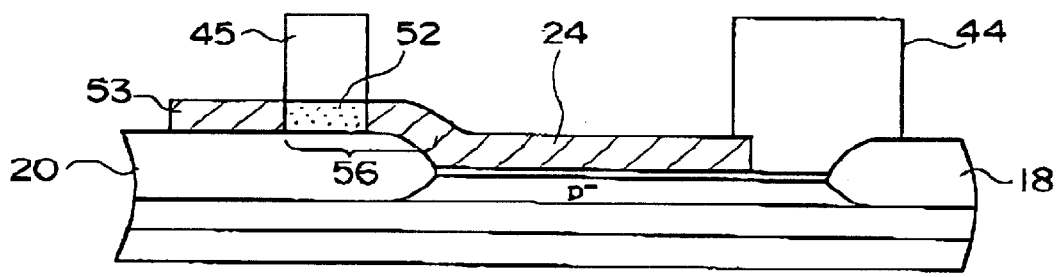
FIG. 23 is a section taken along the line A—A through the structure of the SOI substrate shown in FIG. 22.

The resist layers 44 and 45 and the field oxide films 18 and 20 are used as a mask for the implantation of n-type ions into the region in which the nMOS field-effect transistor will be formed, to form the source region 40 and the drain region 38, as shown in FIGS. 22 and 23 (where FIG. 23 is a section taken along the line A—A through the structure of the SOI substrate of FIG. 22). Phosphorous could be used as the n-type ions, the ion implantation energy could be on the order of 40 keV, and the dosage could be $2\times10^{15}/cm^2$, by way of example. This ion implantation ensures that ions are also implanted into the gate electrode 24, the contact pad layer 53, and the interconnecting portion 56. It should be noted, however, that the resist layer 45 is present on the part of the interconnecting portion 56, so ions are not implanted into that portion. This portion becomes the resistance portion 52.

Note that the following step could be added when the resistance of the resistance portion 52 has not reached the desired value. First of all, the resist layers 44 and 45 are removed after the source region 40 and the drain region 38 have been formed. Implantation of n-type ions into the entire surface of the SOI substrate is done until the resistance of the resistance portion 52 reaches the desired value.

Figure 24:
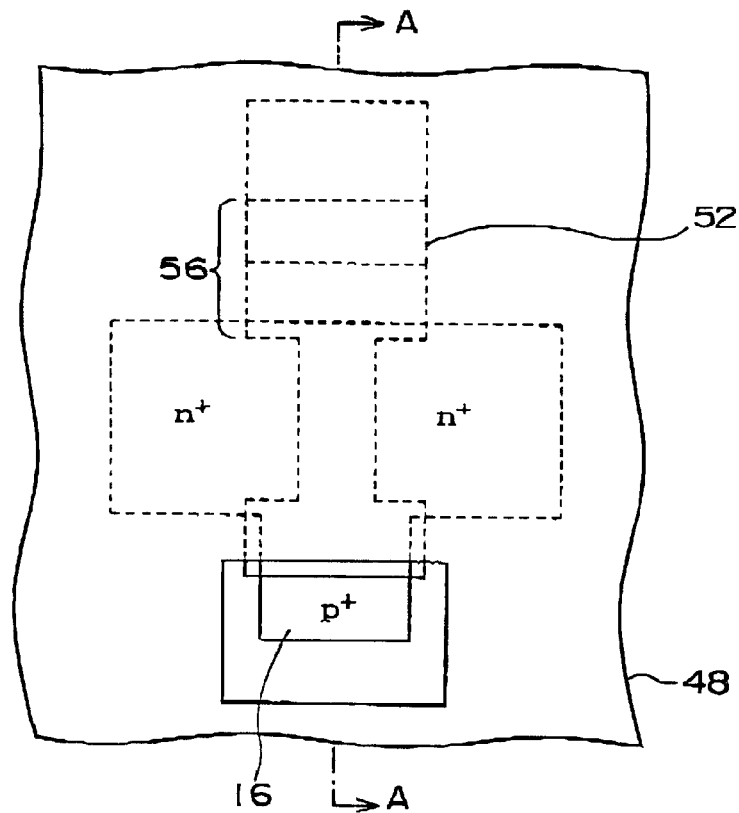
FIG. 24 is a plan view of the SOI substrate, illustrating a fourth step in the method of manufacturing the SOI-structure MOS field-effect transistor in accordance with the second embodiment of the present invention.
Figure 25:
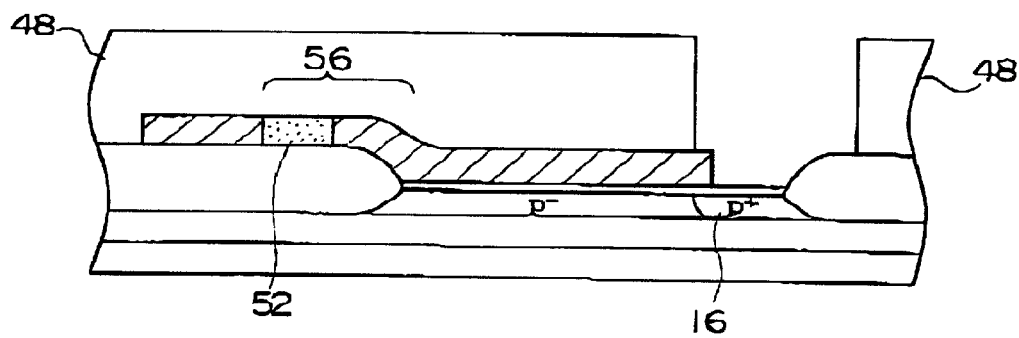
FIG. 25 is a section taken along the line A—A through the structure of the SOI substrate of FIG. 24.

The steps shown in FIGS. 24 and 25 (where FIG. 25 is a section taken along the line A—A through the structure of the SOI substrate of FIG. 24) are then performed. The steps shown in FIGS. 24 and 25 are the same as those described with reference to FIGS. 12 and 13.

Figure 26:
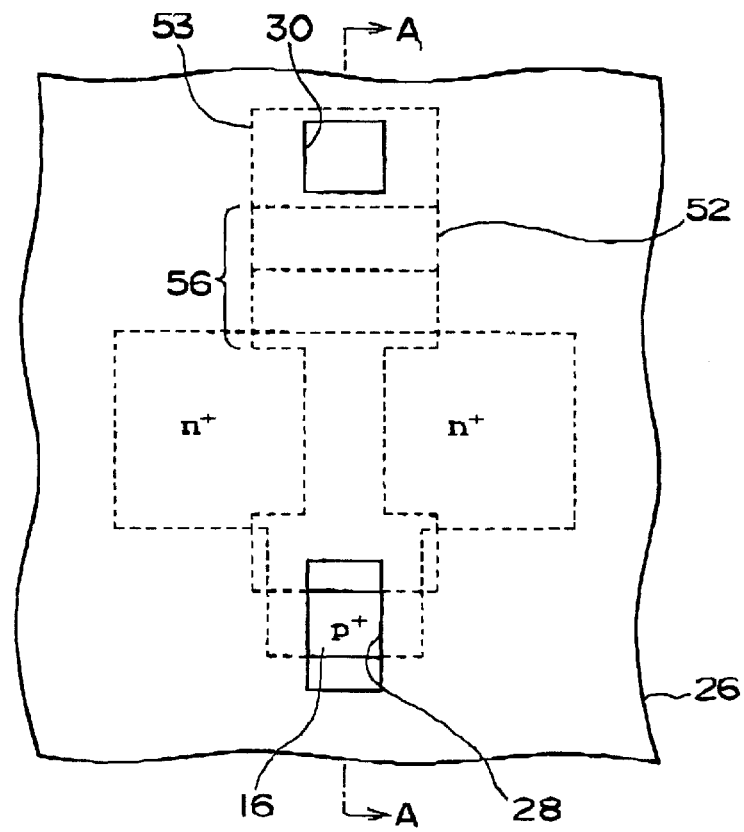
FIG. 26 is a plan view of the SOI substrate, illustrating a fifth step in the method of manufacturing the SOI-structure MOS field-effect transistor in accordance with the second embodiment of the present invention.
Figure 27:
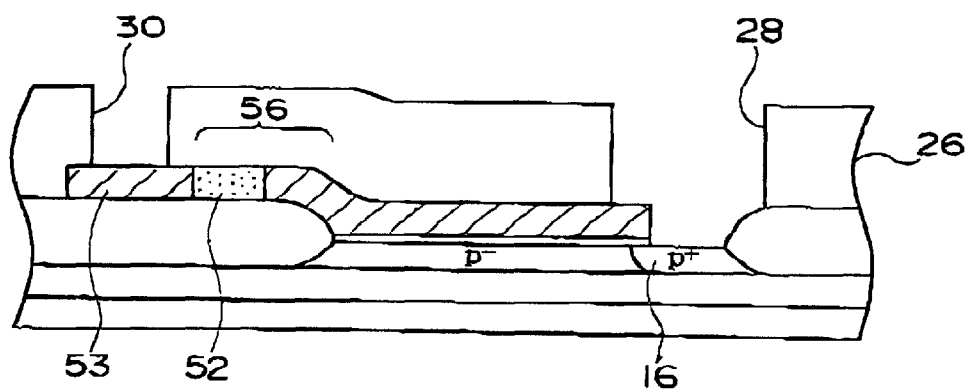
FIG. 27 is a section taken along the line A—A through the structure of the SOI substrate of FIG. 26.

The steps shown in FIGS. 26 and 27 (where FIG. 27 is a section taken along the line A—A through the structure of the SOI substrate shown in, FIG. 26) are then performed. The steps shown in FIGS. 26 and 27 are the same as those described with reference to FIGS. 14 and 15.

The steps shown in FIGS. 16 and 17 are then performed. The steps shown in FIGS. 16 and 17 are the same as those described with reference to FIGS. 1 and 2. This completes the SOI-structure MOS field-effect transistor in accordance with the second embodiment.

Discussion of Effects (Effect 1)

Effect 1 of the SOI-structure MOS field-effect transistor in accordance with the second embodiment of the present invention is the same as effect 1 of the SOI-structure MOS field-effect transistor in accordance with the first embodiment of the present invention.

(Effect 2)

In the SOI-structure MOS field-effect transistor in accordance with the second embodiment of the present invention, illustrated in FIGS. 16 and 17, the part of the interconnecting portion 56 is utilized as the resistance portion 52, by making the impurity concentration in the part of the interconnecting portion 56 less than the impurity concentration in a remaining part of the interconnecting portion 56. Thus this second embodiment of the invention makes it possible to form the film that will become the interconnecting portion and the film that will become the resistance portion, simultaneously, without increasing the area of the resistance portion.

Note that the impurity concentration of the resistance portion 52 is between $1\times10^{17}/cm^3$ and $5\times10^{19}/cm^3$, by way of example. The corresponding resistance is between 10 kΩ and 1 MΩ.

Third Embodiment

Structure

Figure 28:
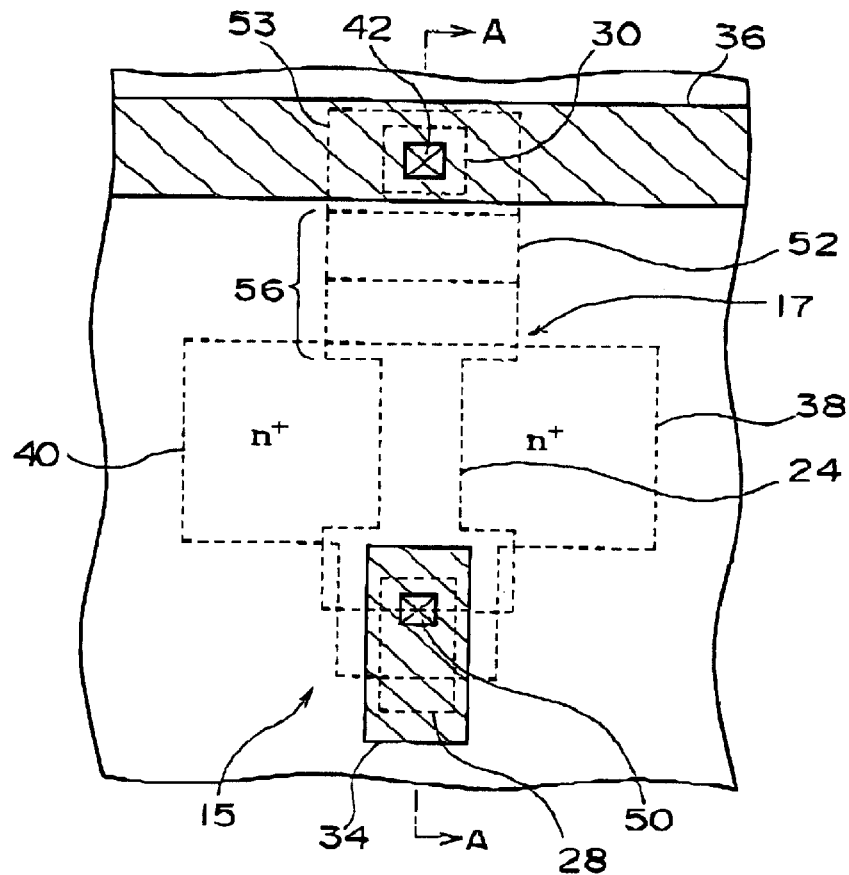
FIG. 28 is a plan view of a SOI-structure MOS field-effect transistor in accordance with a third embodiment of the present invention.
Figure 29:
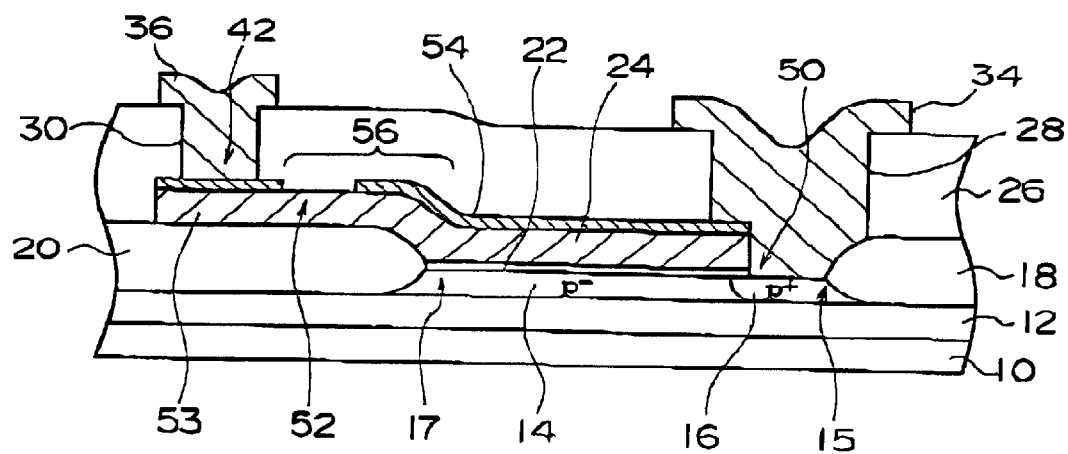
FIG. 29 is a section taken along the line A—A through the SOI-structure MOS field-effect transistor of FIG. 28.

A plan view of a SOI-structure MOS field-effect transistor in accordance with a third embodiment of the present invention is shown in FIG. 28. A section taken along the line A—A through the SOI-structure MOS field-effect transistor of FIG. 28 is shown in FIG. 29. This transistor differs from the SOI-structure MOS field-effect transistor of the first embodiment, shown in FIGS. 1 and 2, in the configuration of the resistance portion 52. In other words, a part of the interconnecting portion 56 in accordance with this third embodiment is utilized as the resistance portion 52 by configuring the part of the interconnecting portion 56 from a polysilicon film alone and a remaining part of the interconnecting portion 56 from the polysilicon film and a silicide film 54. In this description of the SOI-structure MOS field-effect transistor in accordance with the third embodiment of the present invention, structural components that are the same as those of the SOI-structure MOS field-effect transistor of the first embodiment, shown in FIGS. 1 and 2, are denoted by the same reference numbers and further description thereof is omitted.

Manufacturing Method

Figure 30:
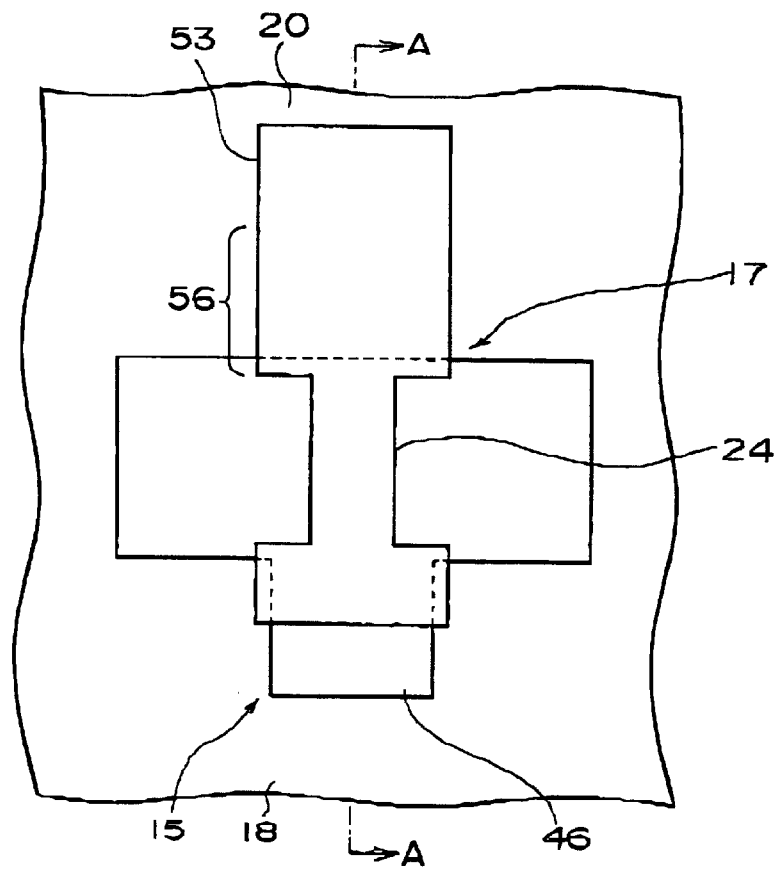
FIG. 30 is a plan view of the SOI substrate, illustrating a first step in the method of manufacturing the SOI-structure MOS field-effect transistor in accordance with the third embodiment of the present invention.
Figure 31:
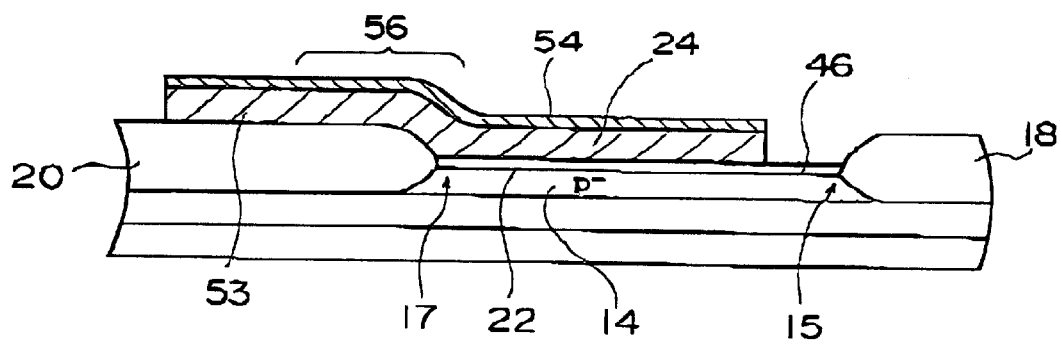
FIG. 31 is a section taken along the line A—A through the structure of the SOI substrate of FIG. 30.

The steps shown in FIG. 4 (FIG. 5) and FIG. 6 (FIG. 7) are first performed. The steps up to this point in the method of manufacturing a SOI-structure MOS field-effect transistor in accordance with the third embodiment are the same as the steps in the method of manufacturing the SOI-structure MOS field-effect transistor in accordance with the first embodiment. After the step shown in FIG. 6 (FIG. 7), as shown in FIG. 30 and FIG. 31 (where FIG. 31 is a section taken along the line A—A through the structure of the SOI substrate of FIG. 30), a thin oxide film that is to form the gate oxide film is formed on the p- region 14. The method and conditions of manufacture can be the same as those used for manufacturing the first embodiment of the present invention. A polysilicon film that is to form the gate electrode is then formed over the entire surface of the SOI substrate, by a method such as CVD. The same conditions as those described for the first embodiment can be used for the formation conditions.

An Mo film (of thickness 50 to 200 nm), which is a refractory metal film, is then formed over the entire surface of the polysilicon film by a method such as sputtering. The formation conditions could be as specified below, by way of example:

Temperature: room temperature to 100° C.

Time: 10 to 30 minutes

The refractory metal film is annealed to form the silicide film 54 on the polysilicon film. The annealing conditions could be as specified below, by way of example:

Temperature: 900 to 1050° C.

Time: several minutes to 30 minutes

The silicide film 54 and the polysilicon film are then patterned by photolithography and etching techniques, to form the gate electrode 24, the interconnecting portion 56, and the contact pad layer 53. The contact pad layer 53 and the interconnecting portion 56 are positioned on the first end portion 17 side of the body region, on the field oxide film 20. The gate electrode 24 and the interconnecting portion 56 are in electrical contact and the contact pad layer 53 and the interconnecting portion 56 are in electrical contact. The region between the gate electrode 24 and the field oxide film 18 becomes the region 46.

Figure 32:
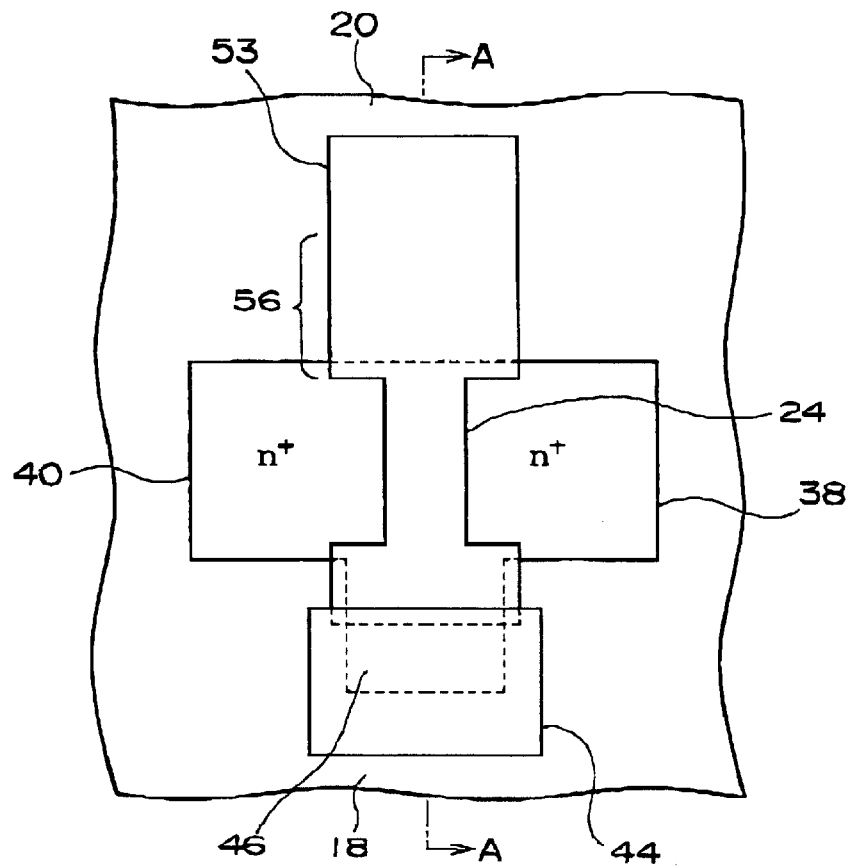
FIG. 32 is a plan view of the SOI substrate, illustrating a second step in the method of manufacturing the SOI-structure MOS field-effect transistor in accordance with the third embodiment of the present invention.
Figure 33:
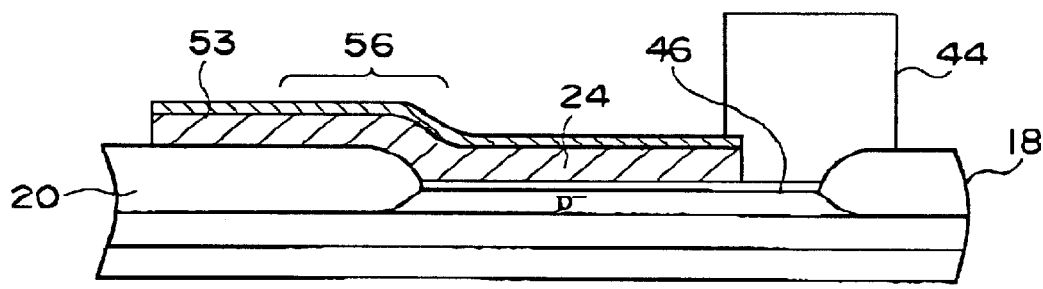
FIG. 33 is a section taken along the line A—A through the structure of the SOI substrate of FIG. 32.

The steps shown in FIGS. 32 and 33 (where FIG. 33 is a section taken along the line A—A through the structure of the SOI substrate of FIG. 32) are then performed. The steps shown in FIGS. 32 and 33 are the same as the steps shown in FIGS. 10 and 11.

Figure 34:
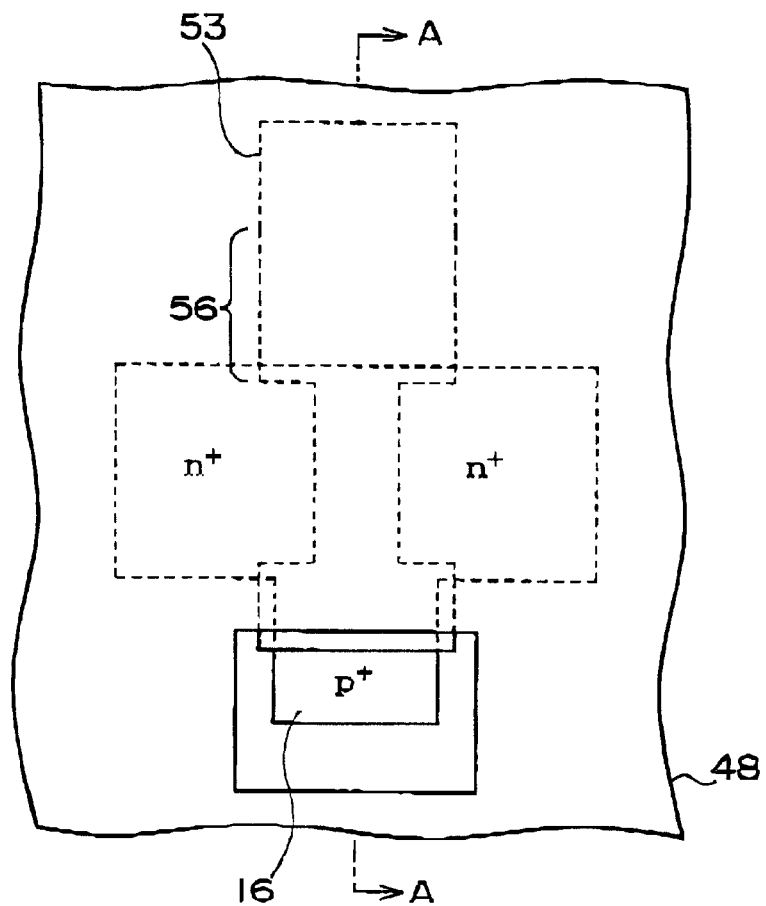
FIG. 34 is a plan view of the SOI substrate, illustrating a third step in the method of manufacturing the SOI-structure MOS field-effect transistor in accordance with the third embodiment of the present invention.
Figure 35:
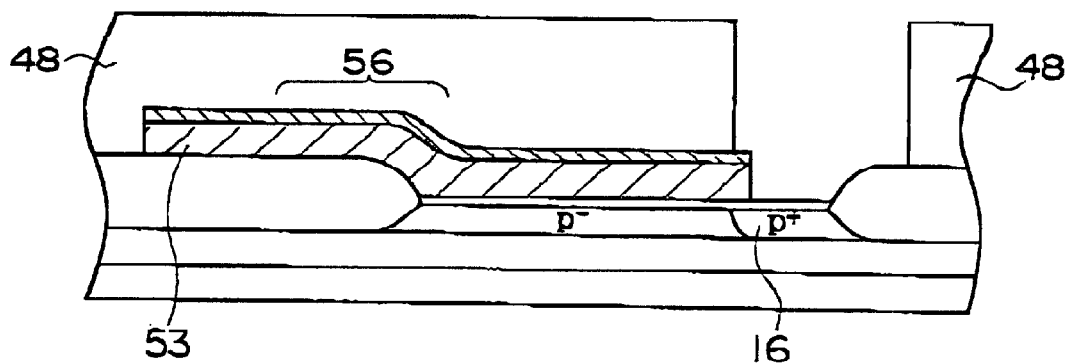
FIG. 35 is a section taken along the line A—A through the structure of the SOI substrate of FIG. 34.

The steps shown in FIGS. 34 and 35 (where FIG. 35 is a section taken along the line A—A through the structure of the SOI substrate of FIG. 34) are then performed. The steps shown in FIGS. 34 and 35 are the same as the steps shown in FIGS. 12 and 13.

Figure 36:
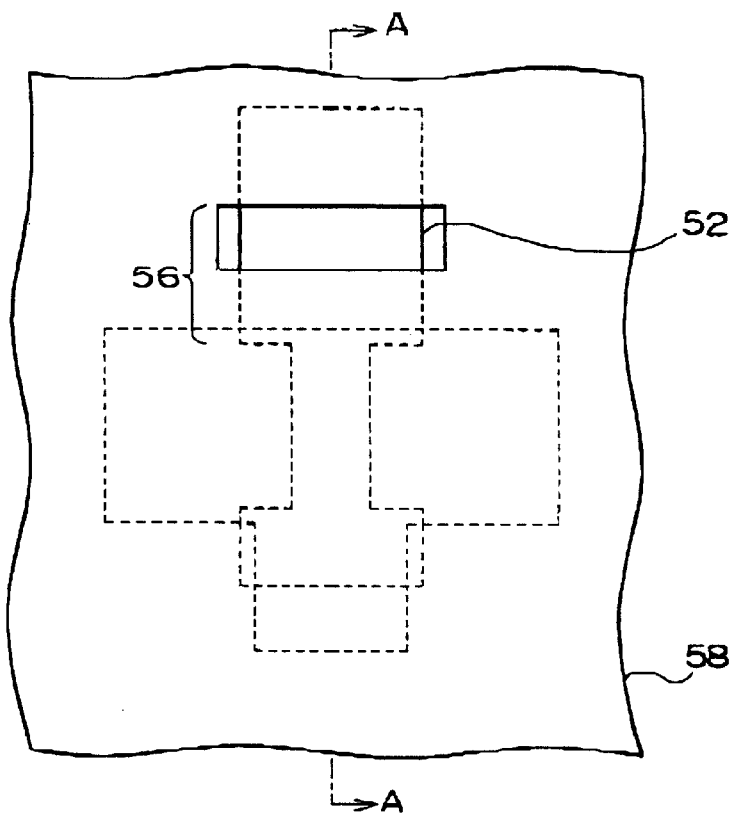
FIG. 36 is a plan view of the SOI substrate, illustrating a fourth step in the method of manufacturing the SOI-structure MOS field-effect transistor in accordance with the third embodiment of the present invention.
Figure 37:
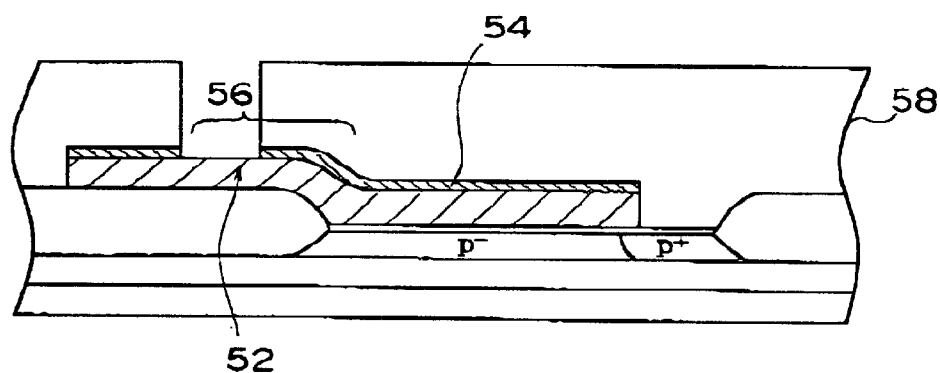
FIG. 37 is a section taken along the line A—A through the structure of the SOI substrate of FIG. 36.

A resist layer 58 is them formed over the entire surface of the SOI substrate, as shown in FIGS. 36 and 37 (where FIG. 37 is a section taken along the line A—A through the structure of the SOI substrate of FIG. 36). The resist layer on the position which is to form the resistance portion is removed. The resist layer 58 is used as a mask for the selective removal of the silicide film 54. The part of the interconnecting portion 56 that is exposed by the removal of the silicide film 54 becomes the resistance portion 52.

Figure 38:
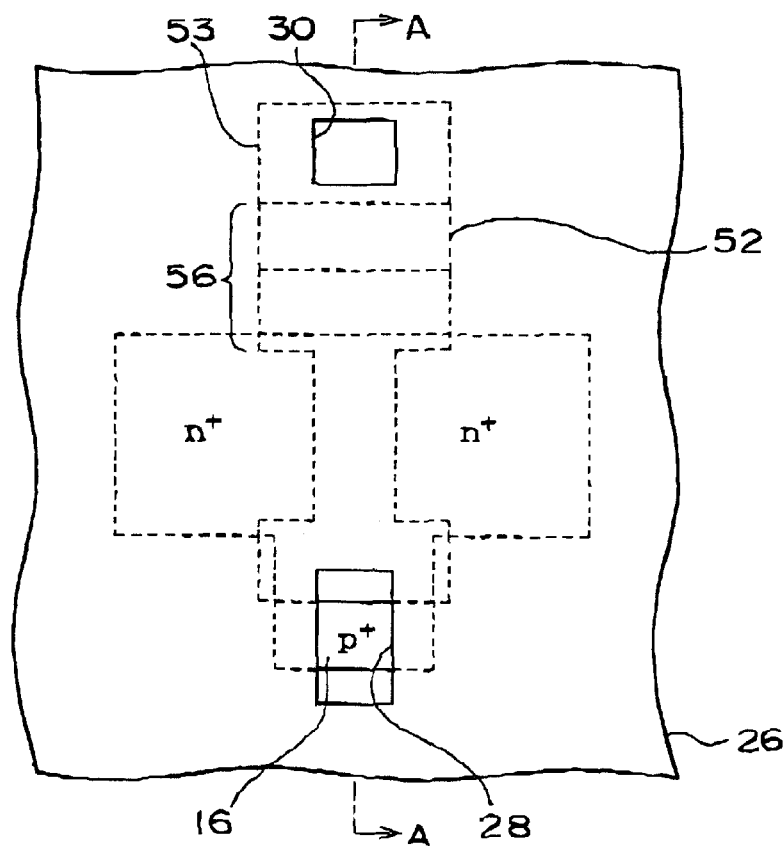
FIG. 38 is a plan view of the SOI substrate, illustrating a fifth step in the method of manufacturing the SOI-structure MOS field-effect transistor in accordance with the third embodiment of the present invention.
Figure 39:
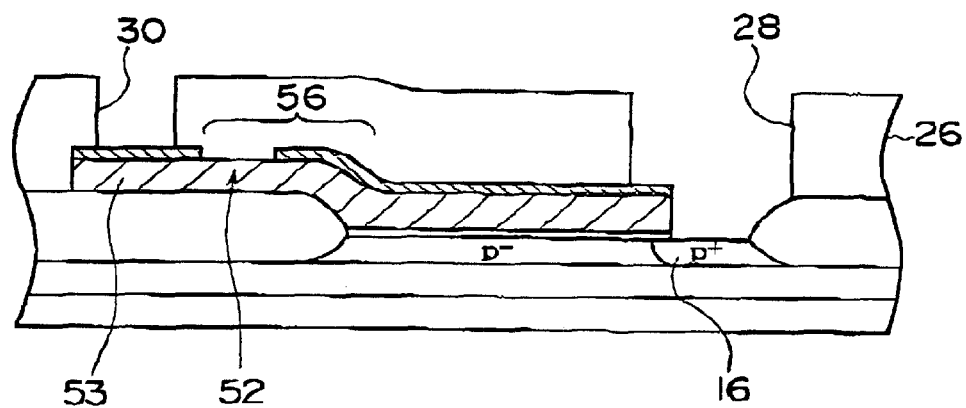
FIG. 39 is a section taken along the line A—A through the structure of the SOI substrate of FIG. 38.

The steps shown in FIGS. 38 and 39 (where FIG. 39 is a section taken along the line A—A through the structure of the SOI substrate of FIG. 38) are then performed. The steps shown in FIGS. 38 and 39 are the same as those described with reference to FIGS. 14 and 15.

The steps shown in FIGS. 28 and 29 are then performed. The steps shown in FIGS. 28 and 29 are the same as those described with reference to FIGS. 1 and 2. This completes the SOI-structure MOS field-effect transistor in accordance with the third embodiment.

Discussion of Effects (Effect 1)

Effect 1 of the SOI-structure MOS field-effect transistor in accordance with the third embodiment of the present invention is the same as effect 1 of the SOI-structure MOS field-effect transistor in accordance with the first embodiment of the present invention.

(Effect 2)

In the SOI-structure MOS field-effect transistor in accordance with the third embodiment of the present invention, illustrated in FIGS. 28 and 29, the part of the interconnecting portion 56 is utilized as the resistance portion 52 by configuring the part of the interconnecting portion 56 from a polysilicon film alone and the remaining part of the interconnecting portion 56 from the polysilicon film and the silicide film 54. The third embodiment of the present invention makes it possible to form the film that will become the interconnecting portion and the film that will become the resistance portion, simultaneously, while reducing the resistance of the resistance portion.

Fourth Embodiment

Structure

Figure 40:
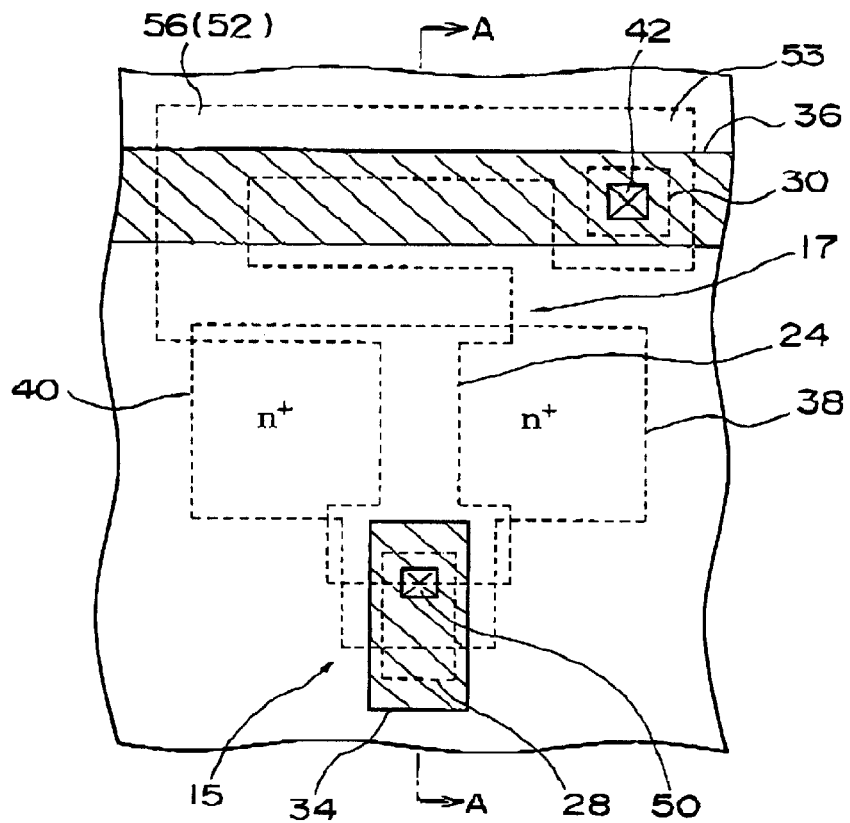
FIG. 40 is a plan view of a SOI-structure MOS field-effect transistor in accordance with a fourth embodiment of the present invention.
Figure 41:
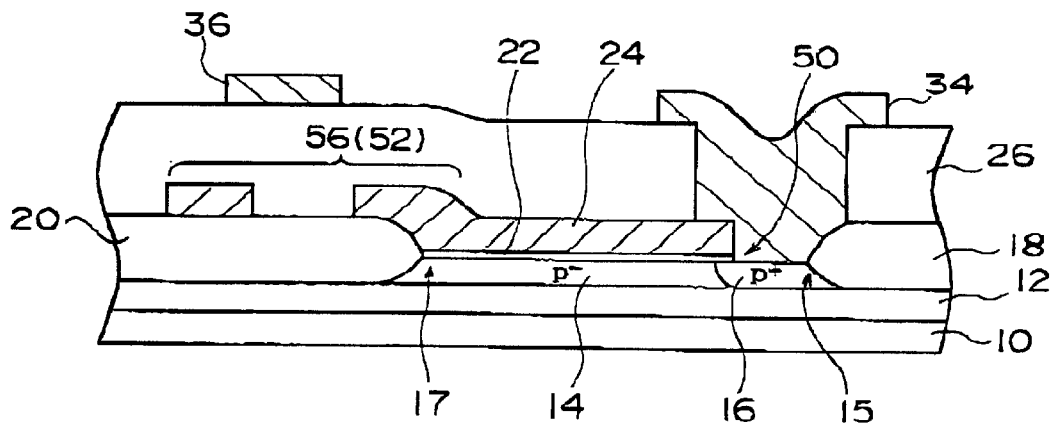
FIG. 41 is a section taken along the line A—A through the SOI-structure MOS field-effect transistor of FIG. 40.

A plan view of a SOI-structure MOS field-effect transistor in accordance with a fourth embodiment of the present invention is shown in FIG. 40. A section taken along the line A—A through the SOI-structure MOS field-effect transistor of FIG. 40 is shown in FIG. 41. This transistor differs from the SOI-structure MOS field-effect transistor of the first embodiment, shown in FIGS. 1 and 2, in the configuration of the resistance portion 52. In other words, the interconnecting portion 56 of the fourth embodiment of the present invention is formed in a circuitous fashion on the surface of the field oxide film 20, in electrical contact with the first contact portion 42. This ensures that the length of the interconnecting portion 56 is at least as long as the shortest distance between the first contact portion 42 and the gate electrode 24. The entire interconnecting portion 56 acts as the resistance portion 52. In this description of the SOI-structure MOS field-effect transistor in accordance with the fourth embodiment of the present invention, structural components that are the same as those of the SOI-structure MOS field-effect transistor of the first embodiment, shown in FIGS. 1 and 2, are denoted by the same reference numbers and further description thereof is omitted.

Manufacturing Method

Figure 42:
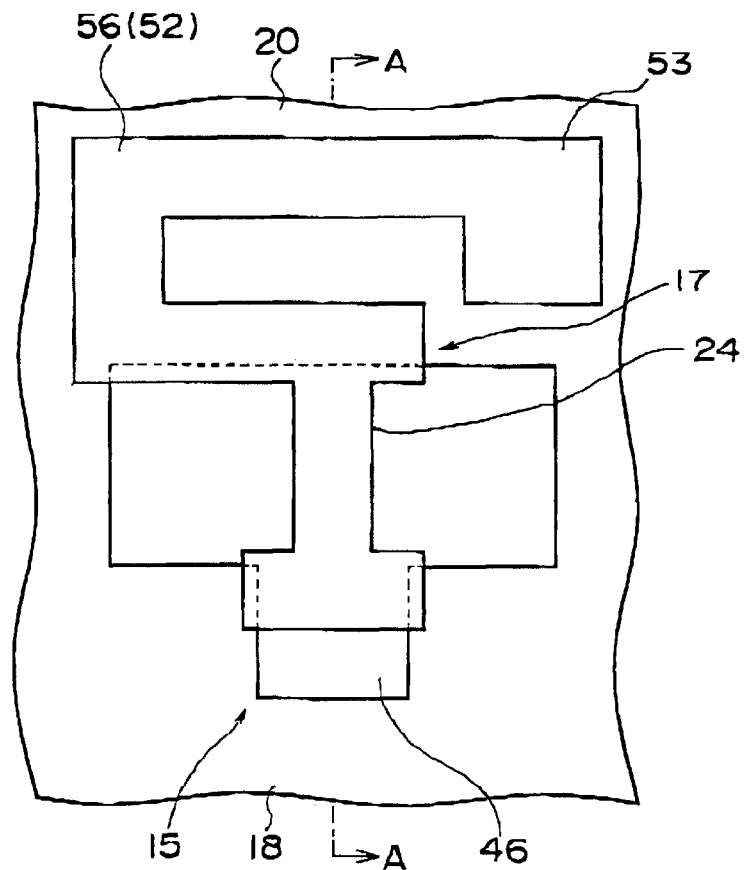
FIG. 42 is a plan view of the SOI substrate, illustrating a first step in the method of manufacturing the SOI-structure MOS field-effect transistor in accordance with the fourth embodiment of the present invention.
Figure 43:
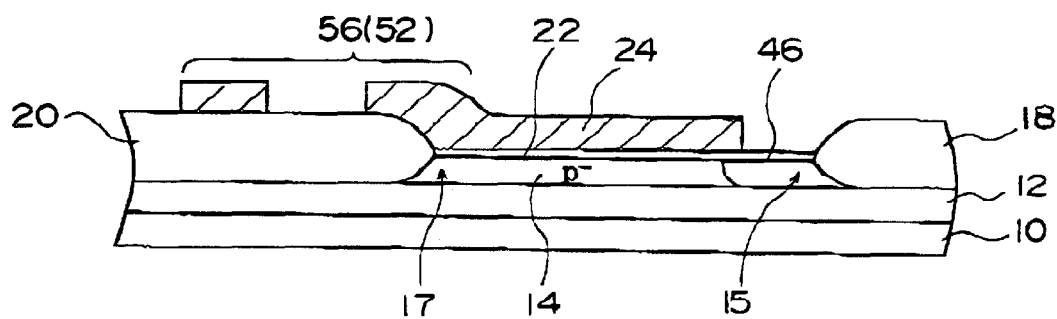
FIG. 43 is a section taken along the line A—A through the structure of the SOI substrate of FIG. 42.

The steps shown in FIG. 4 (FIG. 5) and FIG. 6 (FIG. 7) are first performed. The steps up to this point in the method of manufacturing a SOI-structure MOS field-effect transistor in accordance with the fourth embodiment are the same as the steps in the method of manufacturing the SOI-structure MOS field-effect transistor in accordance with the first embodiment. After the step shown in FIG. 6 (FIG. 7), a thin oxide film that is to form the gate oxide film is formed on the p- region 14, as shown in FIGS. 42 and 43 (where FIG. 43 is a section taken along the line A—A through the structure of the SOI substrate of FIG. 42). The method and condition of manufacture can be the same as those used for manufacturing the first embodiment of the present invention. A polysilicon film that is to form the gate electrode is then formed over the entire surface of the SOI substrate, by a method such as CVD. The same conditions as those described for the first embodiment can be used for the formation conditions.

The polysilicon film is then patterned by photolithography and etching techniques to form the gate electrode 24, the interconnecting portion 56, and the contact pad layer 53. The contact pad layer 53 and the interconnecting portion 56 are positioned on the first end portion 17 side of the body region, on the field oxide film 20. The gate electrode 24 and the interconnecting portion 56 are in electrical contact. The interconnecting portion 56 extends in a circuitous fashion to the contact pad layer 53, and the contact pad layer 53 and the interconnecting portion 56 are in electrical contact. The region between the gate electrode 24 and the field oxide film 18 becomes the region 46.

Figure 44:
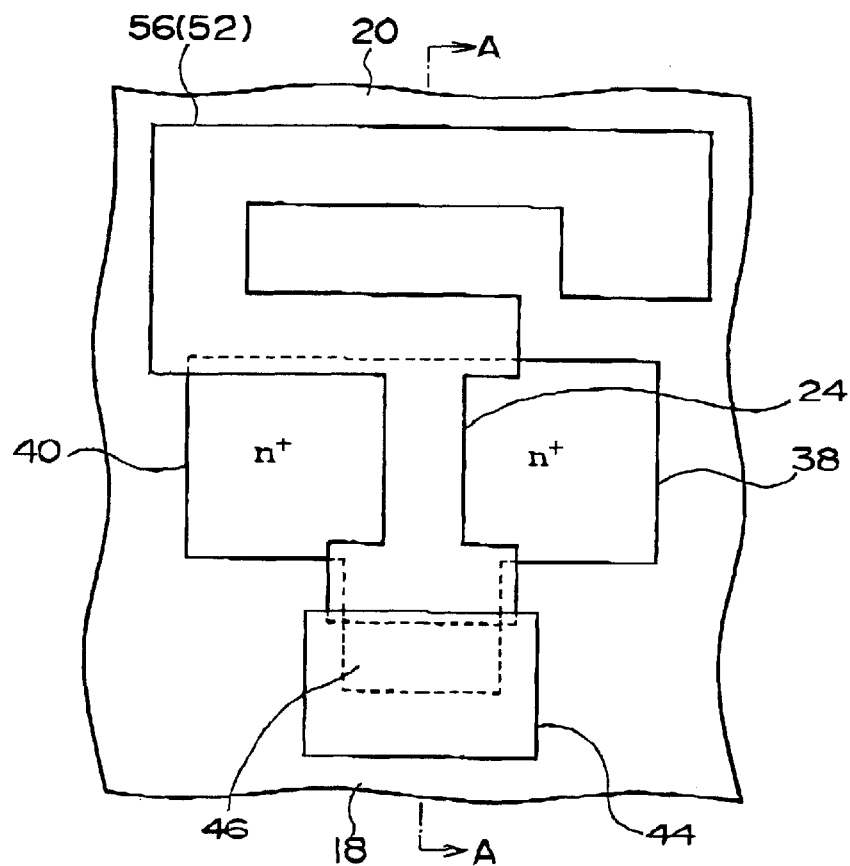
FIG. 44 is a plan view of the SOI substrate, illustrating a second step in the method of manufacturing the SOI-structure MOS field-effect transistor in accordance with the fourth embodiment of the present invention.
Figure 45:
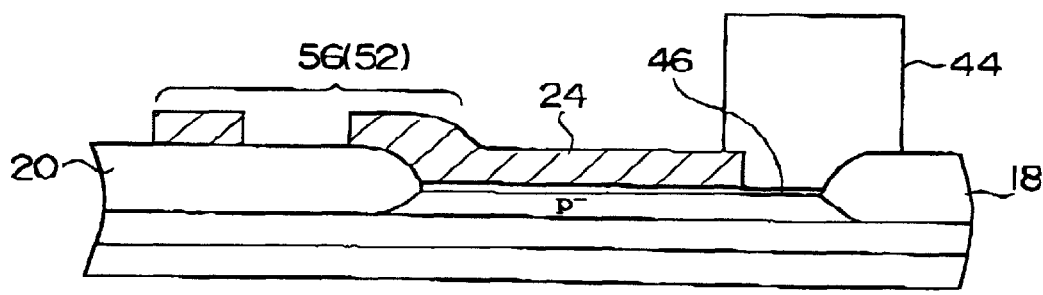
FIG. 45 is a section taken along the line A—A through the structure of the SOI substrate of FIG. 44.

The steps shown in FIGS. 44 and 45 (where FIG. 45 is a section taken along the line A—A through the structure of the SOI substrate of FIG. 44) are then performed. The steps shown in FIGS. 44 and 45 are the same as those described with reference to FIGS. 10 and 11.

Figure 46:
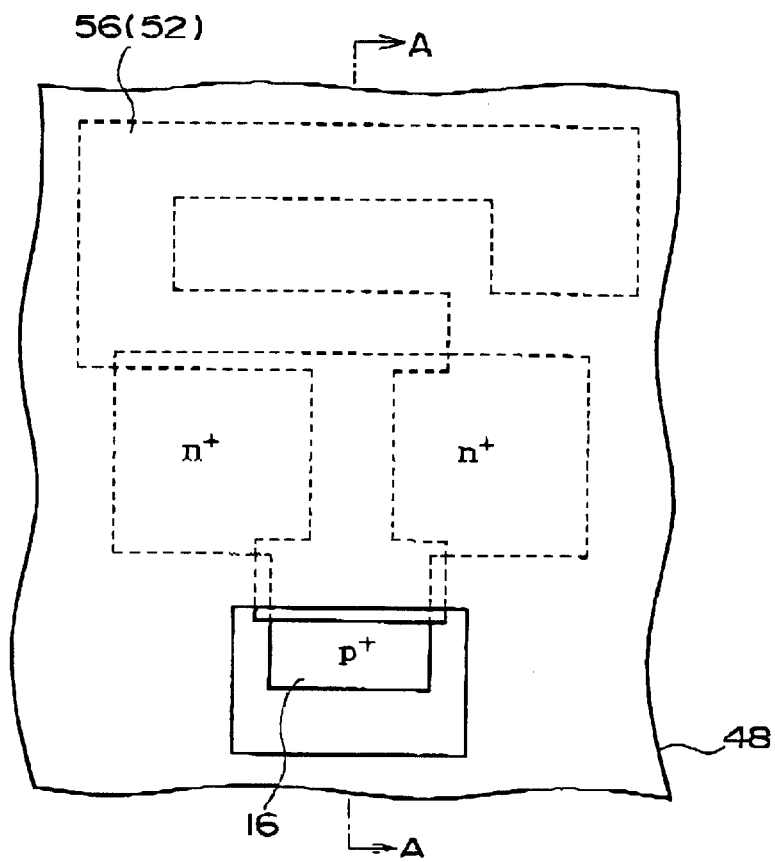
FIG. 46 is a plan view of the SOI substrate, illustrating a third step in the method of manufacturing the SOI-structure MOS field-effect transistor in accordance with the fourth embodiment of the present invention.
Figure 47:
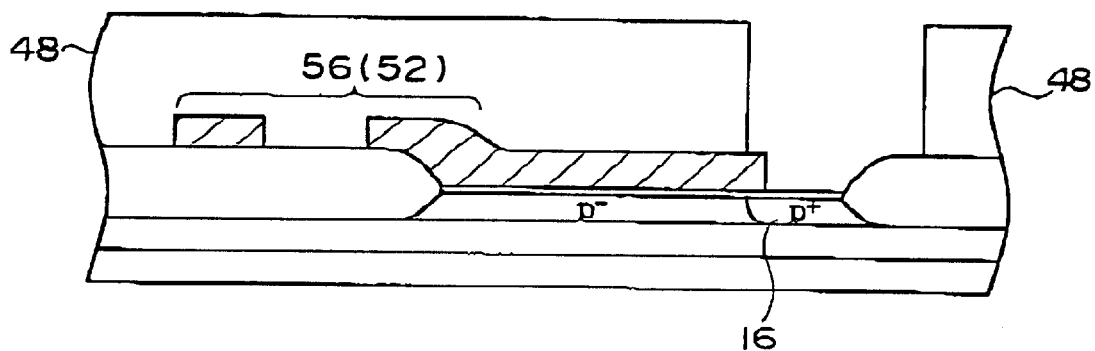
FIG. 47 is a section taken along the line A—A through the structure of the SOI substrate of FIG. 46.

The steps shown in FIGS. 46 and 47 (where FIG. 47 is a section taken along the line A—A through the structure of the SOI substrate of FIG. 46) are then performed. The steps shown in FIGS. 46 and 47 are the same as those described with reference to FIGS. 12 and 13.

Figure 48:
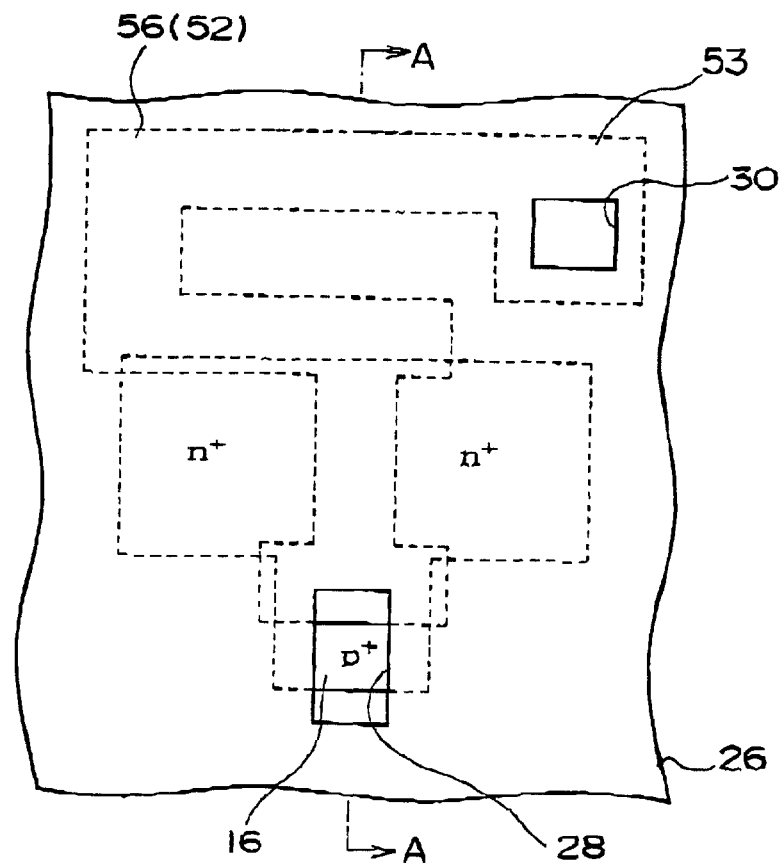
FIG. 48 is a plan view of the SOI substrate, illustrating a fourth step in the method of manufacturing the SOI-structure MOS field-effect transistor in accordance with the fourth embodiment of the present invention.
Figure 49:
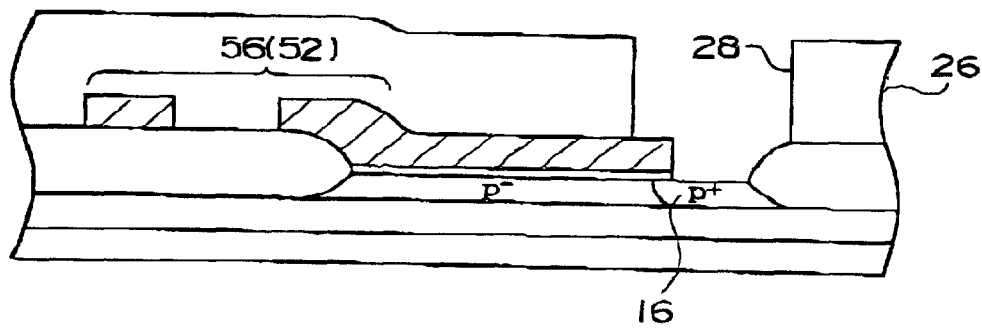
FIG. 49 is a section taken along the line A—A through the structure of the SOI substrate of FIG. 48.

The steps shown in FIGS. 48 and 49 (where FIG. 49 is a section taken along the line A—A through the structure of the SOI substrate of FIG. 48) are then performed. The steps shown in FIGS. 48 and 49 are the same as those described with reference to FIGS. 14 and 15.

The steps shown in FIGS. 40 and 41 are then performed. The steps shown in FIGS. 40 and 41 are the same as those described with reference to FIGS. 1 and 2. This completes the SOI-structure MOS field-effect transistor in accordance with the fourth embodiment.

Discussion of Effects (Effect 1)

Effect 1 of the SOI-structure MOS field-effect transistor in accordance with the fourth embodiment of the present invention is the same as effect 1 of the SOI-structure MOS field-effect transistor in accordance with the first embodiment of the present invention.

(Effect 2)

In the SOI-structure MOS field-effect transistor in accordance with the fourth embodiment of the present invention, illustrated in FIGS. 40 and 41, the interconnecting portion 56 is extended in a circuitous fashion and is connected electrically to the first contact portion 42. The length of the interconnecting portion 56 is greater than the shortest distance between the first contact portion 42 and the gate electrode 24. By lengthening the interconnecting portion 56, the fourth embodiment of the invention employs the entire interconnecting portion 56 as the resistance portion 52. This fourth embodiment makes it possible to form the resistance portion on the field oxide film, thus making efficient use of the region above the field oxide film.

Experimental Examples

Figure 50:
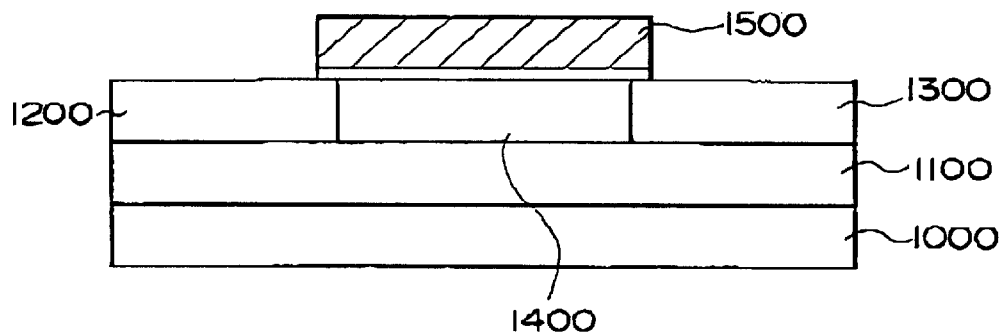
FIG. 50 is a schematic view of an example of a SOI-structure MOS field-effect transistor.
Figure 51:
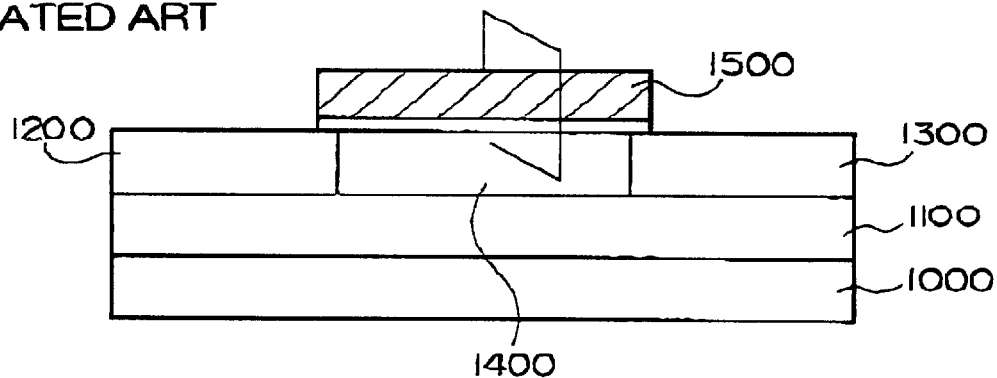
FIG. 51 is a schematic view of another example of a SOI-structure MOS field-effect transistor.
Figure 52:
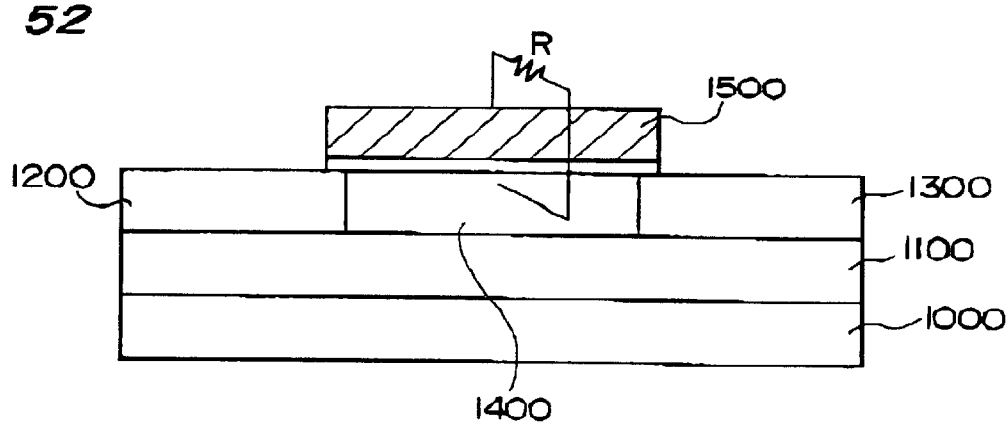
FIG. 52 is a schematic view of a SOI-structure MOS field-effect transistor in accordance with an embodiment of the present invention.

The description now turns to experimental examples of the effects produced by the provision of a resistance portion R, while discussing the characteristics of a DTMOS. A schematic view of a typical SOI-structure MOS field-effect transistor is shown in FIG. 50. This configuration has been described already in the Background of the Invention and is hereinafter called a floating-body type of field-effect transistor. A schematic view of another typical SOI-structure MOS field-effect transistor is shown in FIG. 51. This configuration has been described already in the Background of the Invention and is hereinafter called a DTMOS type of field-effect transistor. A schematic view of yet another typical SOI-structure MOS field-effect transistor is shown in FIG. 52. The configuration of FIG. 52 differs from that of FIG. 51 in that the configuration of FIG. 52 is provided with the resistance portion R. This is a DTMOS type of field-effect transistor in accordance with an embodiment of the present invention.

MOS field-effect transistors of this type have two operating modes: fully depleted and partially depleted. In general, a fully depleted transistor has a body region that is thinner than that of a partially depleted transistor. Thus the entire body region becomes a depleted layer. In contrast thereto, a base portion of the body region of a partially depleted transistor is not a depleted layer.

Figure 53:
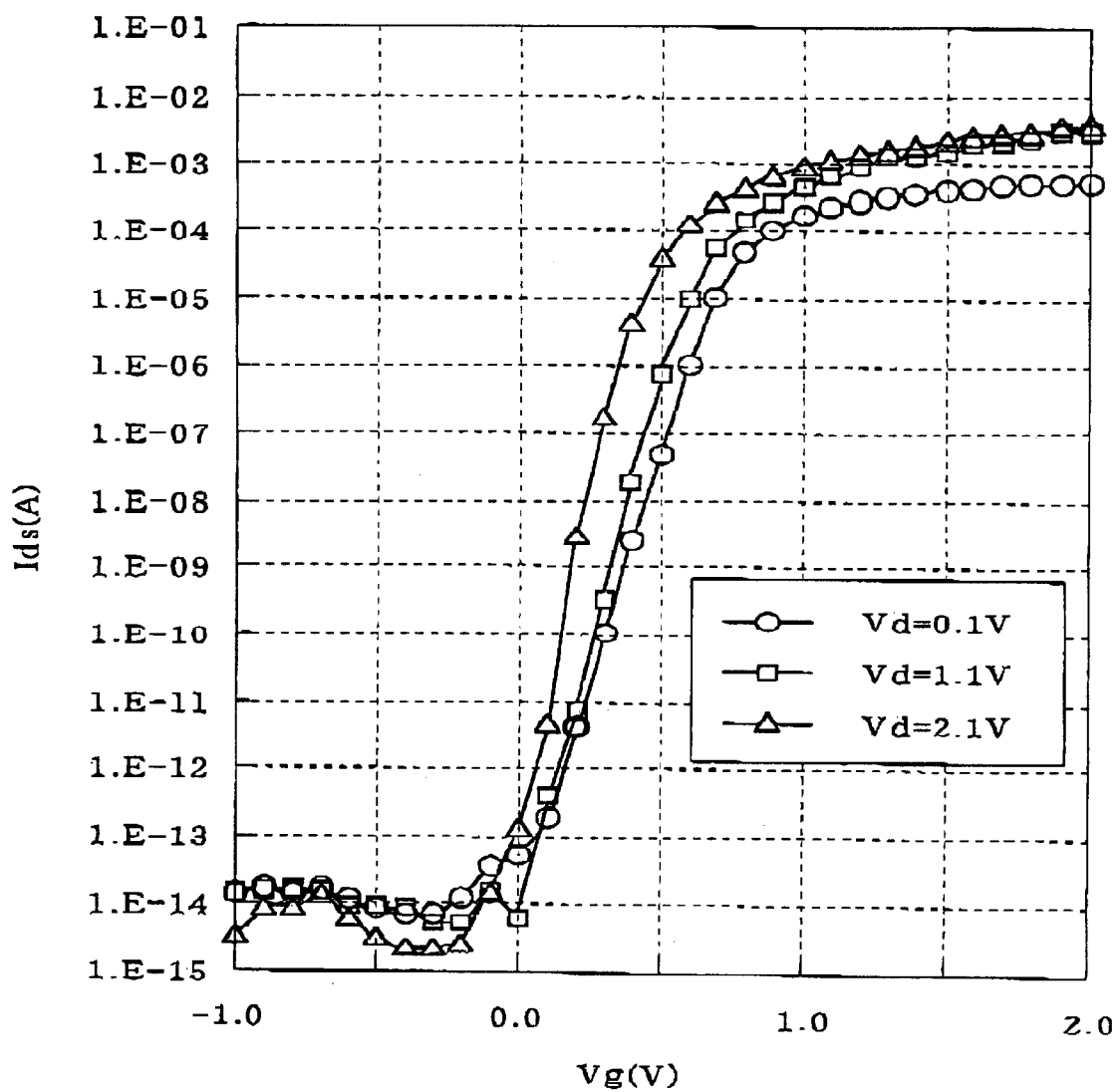
FIG. 53 is a graph of the characteristics of a floating-body type of field-effect transistor (partially depleted)

The relationship between the gate voltage (Vg) and the drain-source current (Ids) of the floating-body type of field-effect transistor (partially depleted) is shown graphically in FIG. 53. The conditions are as follows:

Operation mode: Partially depleted
Thickness of body region: 175 nm
Element separation method: LOCOS
Width of gate electrode: 25 $\mu$m
Length of gate electrode: 0.6 $\mu$
Drain voltage Vd: 0.1 V, 1.1 V, 2.1 V
Resistance Portion: None As is clear from the graph, when the gate voltage (Vg) is within the vicinity of 0.5 V, the current (Ids) rises sharply as the drain voltage (Vd) rises, for all values of the gate voltage (Vg). This is because the substrate floating effect occurs as the drain voltage (Vd) rises, causing a drop in the threshold value.

A current (Ids) of 1.E–03 (A), for example, means a current of 1 mA flowing between the drain and the source.

$$1.E\text{--}03(A) = 1.0 \times 10^{-3}(A) = 1.0(mA)$$

Note that the vertical axis (Ids) in the Vg-Ids characteristics shown in FIGS. 53 to 59 indicates the magnitude of current between the gate and source added to the current between the drain and the source, in each field-effect transistor.

Figure 54:
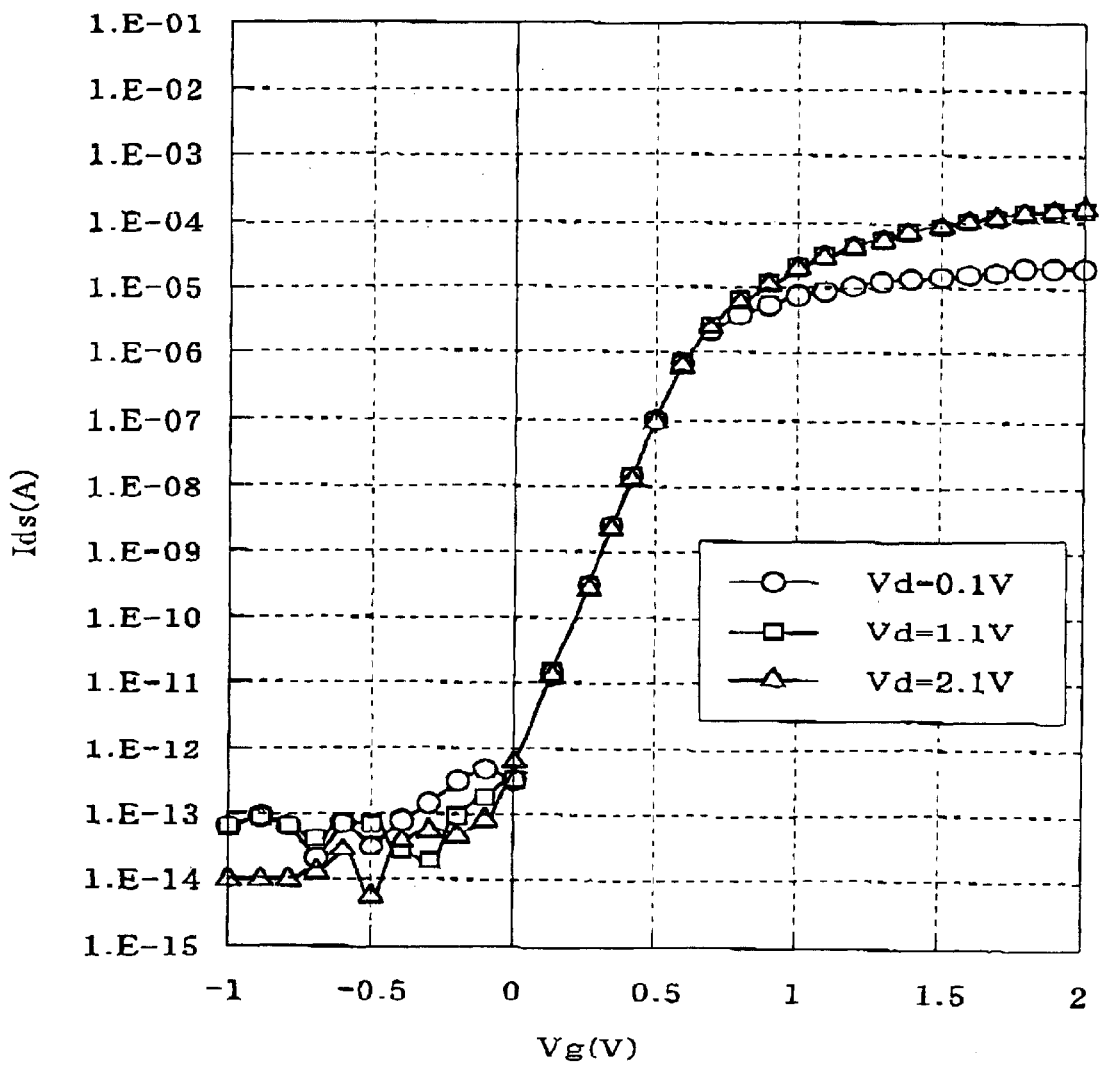
FIG. 54 is a graph of the characteristics of a floating-body type of field-effect transistor (fully depleted)

The relationship between the gate voltage (Vg) and the drain-source current (Ids) of the floating-body type of field-effect transistor (fully depleted) is shown graphically in FIG. 54. The conditions are as follows:

Operating mode: Fully depleted
Thickness of body region: 55 nm
Element separation method: LOCOS
Width of gate electrode: 25 $\mu$m
Length of gate electrode: 0.6 $\mu$m
Drain voltage Vd: 0.1 V, 1.1 V, 2.1 V
Resistance portion: None As is clear from the graph, the same phenomenon occurs in a fully depleted transistor as in a partially depleted one.

Figure 55:
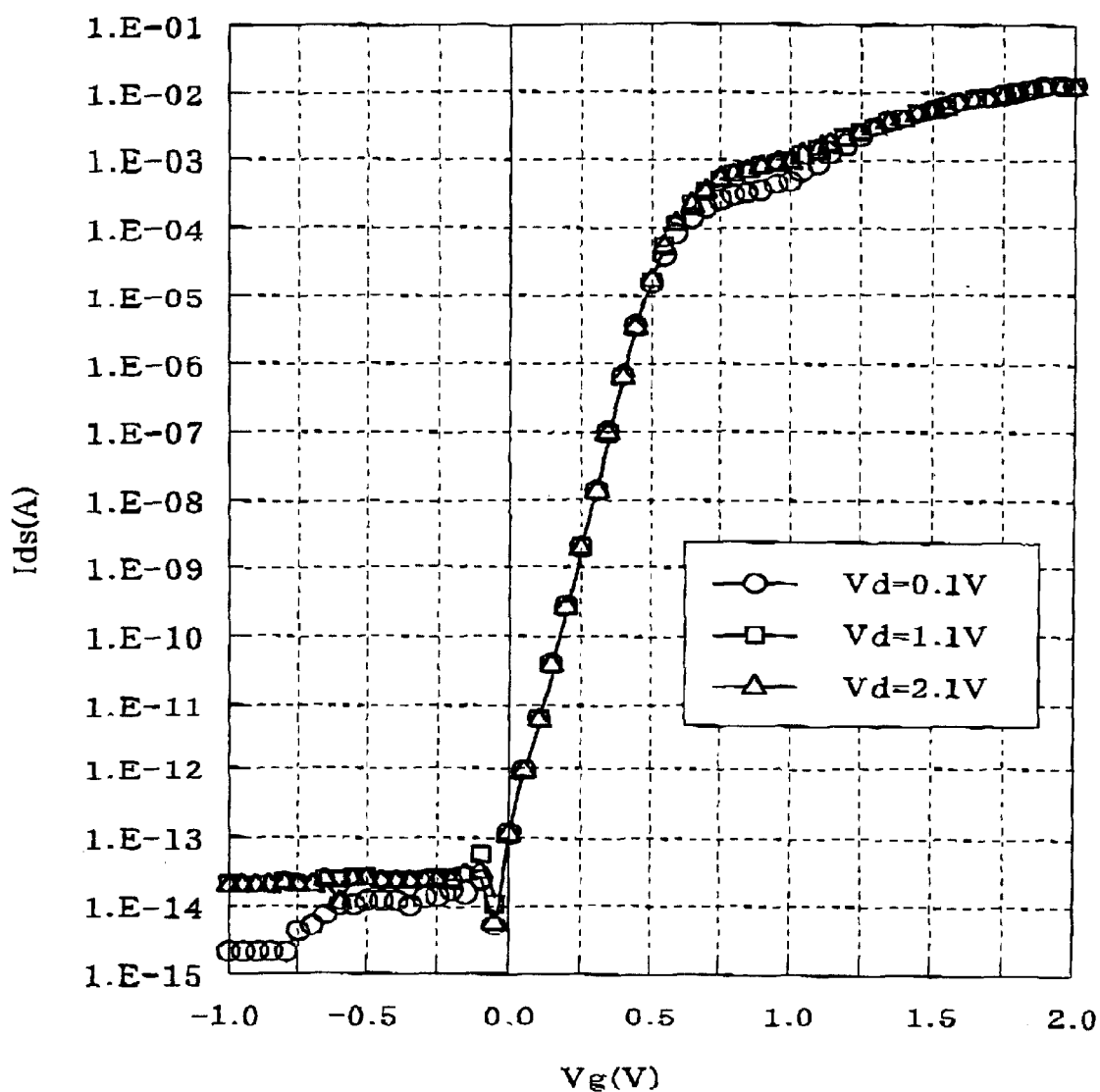
FIG. 55 is a graph of the characteristics of a DTMOS type of field-effect transistor (partially depleted)

The relationship between the gate voltage (Vg) and the drain-source current (Ids) in a DTMOS type of field-effect transistor (partially depleted) is shown in FIG. 55. The conditions are as follows:

Operating mode: Partially depleted
Thickness of body region: 175 nm
Element separation method: LOCOS
Width of gate electrode: 25 $\mu$m
Length of gate electrode: 0.6 $\mu$m
Drain voltage Vd: 0.1 V, 1.1 V, 2.1 V
Resistance portion: None As is clear from the graph, the phenomenon that occurs in a floating-body type of field-effect transistor (partially depleted), as described above, hardly occurs at all in a DTMOS type of field-effect transistor, even a partially depleted one.

However, the current (Ids) increases strangely in the region from a gate voltage (Vg) of 0.8 V upwards, in comparison with FIG. 53. This is because the current (Igs) flowing from the gate electrode, through the body region, and into the source region is added to the current between the drain and source. This increase in the current (Igs) is the reason why there is a limit to the power voltage range wherein the DTMOS type of field-effect transistor without the resistance portion R can be used.

Figure 56:
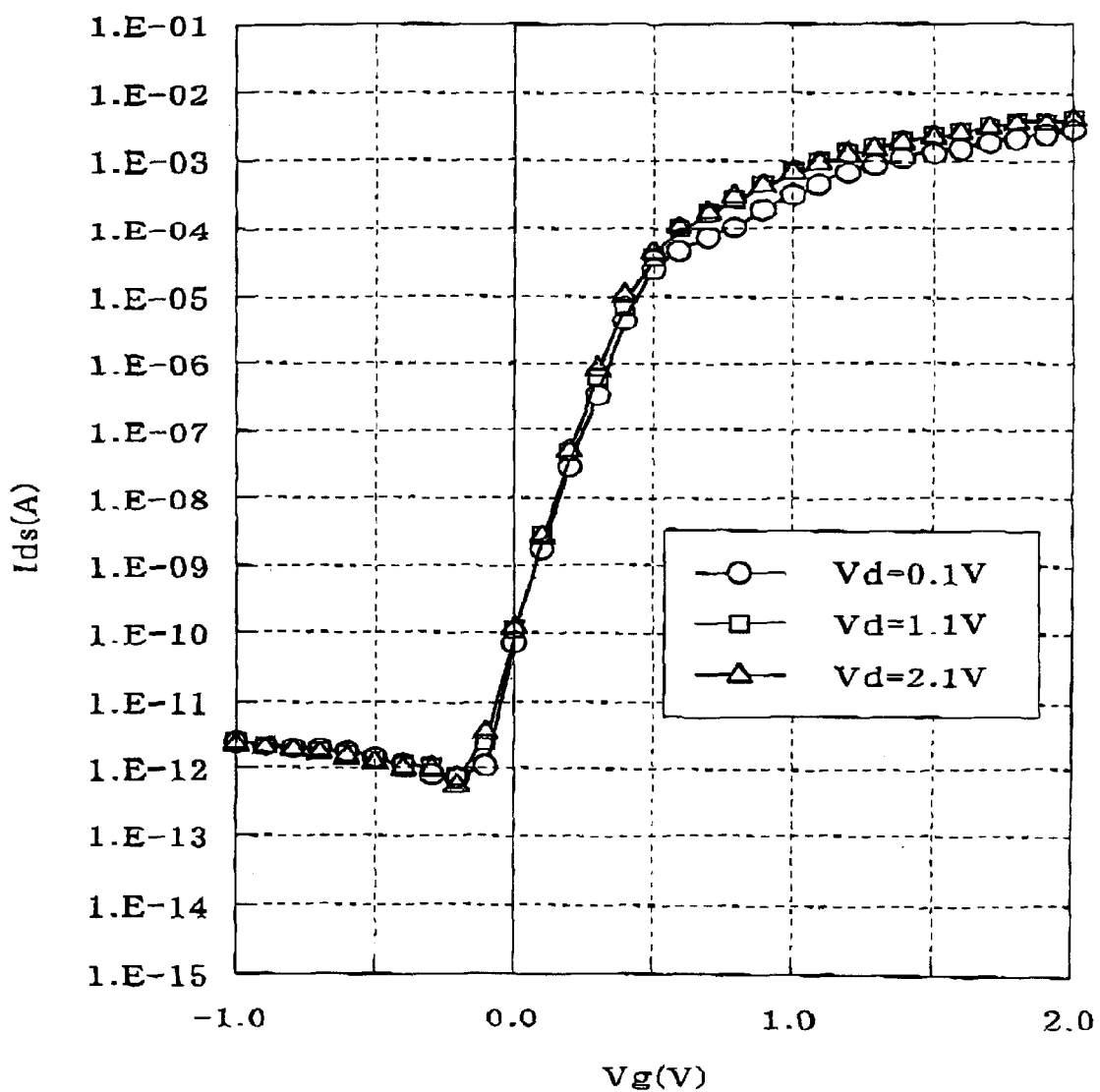
FIG. 56 is a graph of the characteristics of a DTMOS type of field-effect transistor (fully depleted)

The relationship between the gate voltage (Vg) and the drain-source current (Ids) of a DTMOS type of field-effect transistor (fully depleted) is shown in FIG. 56. The conditions are as follows:

Operating mode: Fully depleted
Thickness of body region: 55 nm
Element separation method: LOCOS
Width of gate electrode: 25 $\mu$m
Length of gate electrode: 0.6 $\mu$m
Drain voltage Vd: 0.1 V, 1.1 V, 2.1 V
Resistance portion: None As is clear from the graph, the phenomenon that occurs in a floating-body type of field-effect transistor (partially depleted), as described above, hardly occurs at all in a DTMOS type of field-effect transistor (fully depleted).

However, the current (Ids) increases strangely in the region from a gate voltage (Vg) of the vicinity of 0.7 V upwards, in comparison with FIG. 54. This is because the current (Igs) flowing from the gate electrode, through the body region, and into the source region is added to the current between the drain and source.

Figure 57:
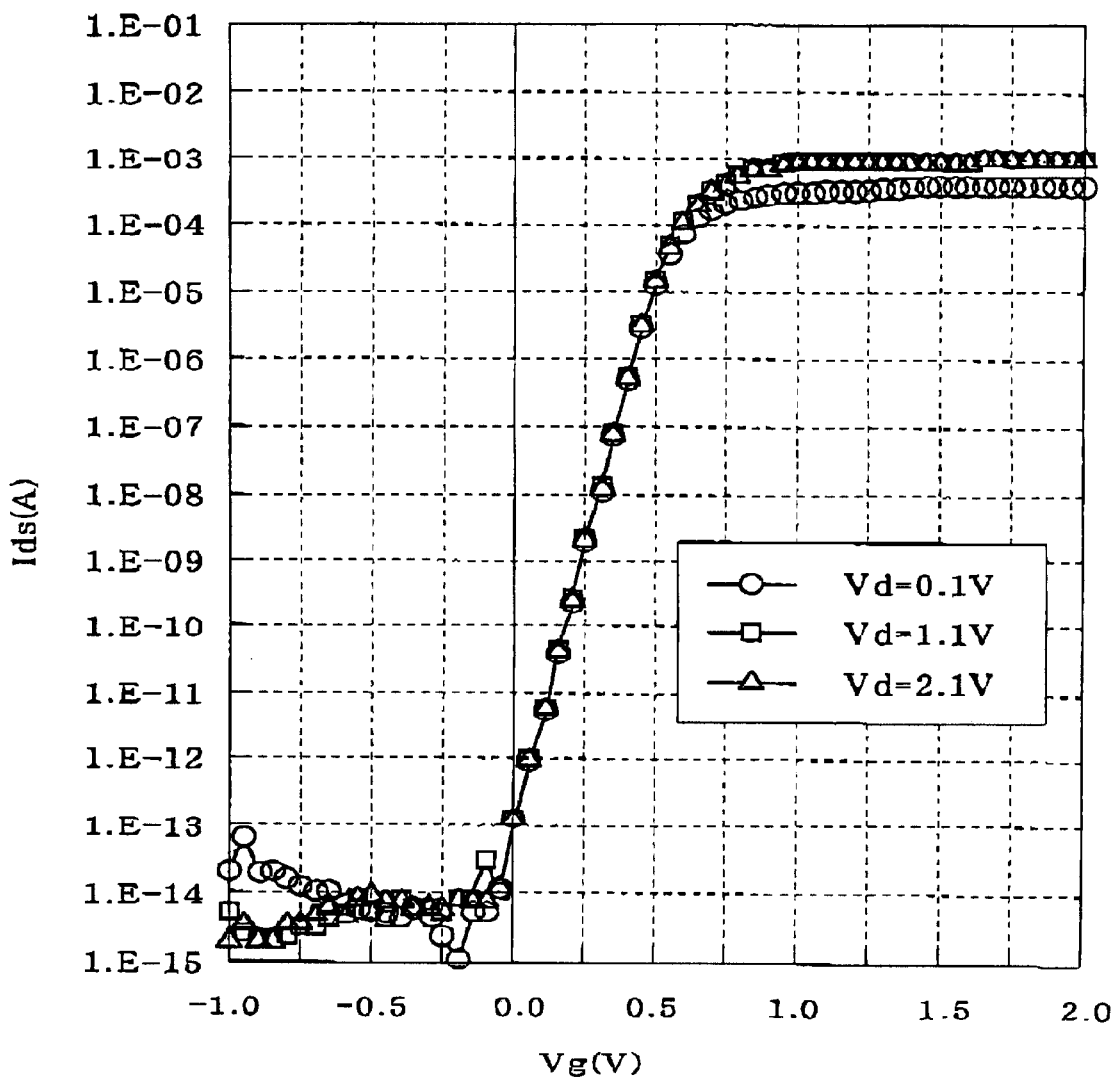
FIG. 57 is a graph of the characteristics of a DTMOS type of field-effect transistor (partially depleted) in accordance with an embodiment of the present invention.

The relationship between the gate voltage (Vg) and the drain-source current (Ids) of a DTMOS type of field-effect transistor in accordance with an embodiment of the present invention is shown in FIG. 57. The conditions are as follows:

Operating mode: Partially depleted
Thickness of body region: 175 nm

Element separation method: LOCOS
Width of gate electrode: 25 µm
Length of gate electrode: 0.6 µm
Drain voltage Vd: 0.1 V, 1.1 V, 2.1 V
Resistance portion: Present (56 kΩ)

The DTMOS type of field-effect transistor in accordance with an embodiment of the present invention is provided with the resistance portion R. As is clear from the graph, the current Ids in the DTMOS type of field-effect transistor in accordance with an embodiment of the present invention is restrained to within a range in the vicinity of 1.E-03, even when the gate voltage (Vg) is comparatively high (1.0 V or higher). This is because the current between the body region and the source region is restrained by the resistance portion R. The DTMOS type of field-effect transistor in accordance with an embodiment of the present invention can therefore have a reduced current (Ids), and thus a reduced power consumption, even when used under conditions of a comparatively high gate voltage. In contrast thereto, the current (Ids) in a DTMOS type of field-effect transistor that is not provided with the resistance portion R (see FIG. 55) cannot be restrained to within a range in the vicinity of 1.E-03 when the gate voltage (Vg) becomes comparatively high (1.0 V or higher).

In addition, a DTMOS type of field-effect transistor in accordance with an embodiment of the present invention does not experience the same phenomenon that occurs in the floating-body type of field-effect transistor (partially depleted), as described above.

Figure 58:
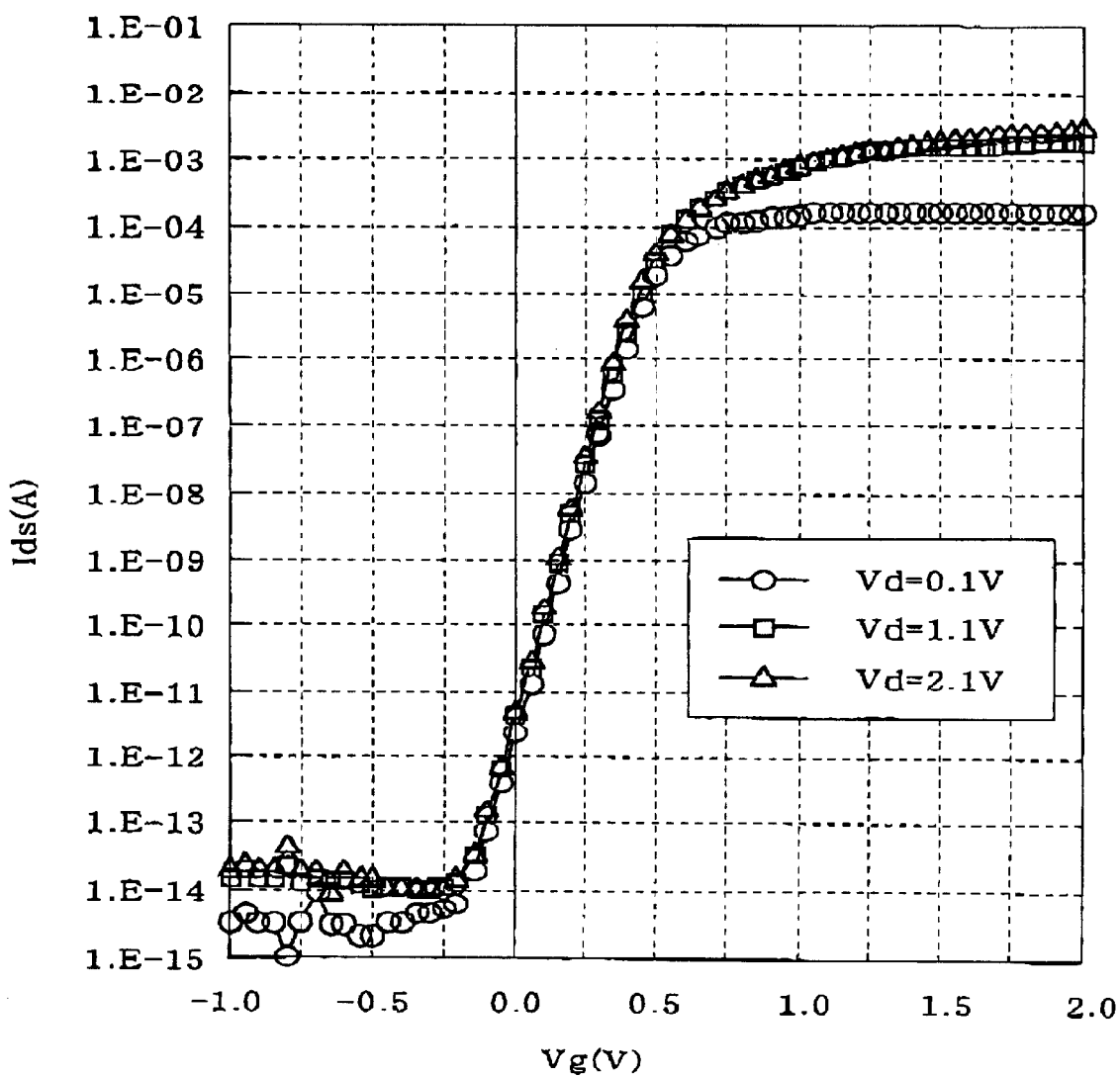
FIG. 58 is a graph of the characteristics of a DTMOS type of field-effect transistor (fully depleted) in accordance with an embodiment of the present invention.

The relationship between the gate voltage (Vg) and the drain-source current (Ids) of a DTMOS type of field-effect transistor in accordance with an embodiment of the present invention is shown in FIG. 58. The conditions are as follows:

Operating mode: Fully depleted
Thickness of body region: 55 nm
Element separation method: LOCOS
Width of gate electrode: 25 µm
Length of gate electrode: 0.6 µm
Drain voltage Vd: 0.1 V, 1.1 V, 2.1 V
Resistance portion: Present (56 kΩ)

The excessive increase in the current (Ids) that can be seen in FIG. 56 is not seen in FIG. 58. This is because the current (Ids) is restricted by the resistance portion R.

In addition, a DTMOS type of field-effect transistor in accordance with an embodiment of the present invention does not experience the same phenomenon that occurs in the floating-body type of field-effect transistor (partially depleted), as described above.

Figure 59:
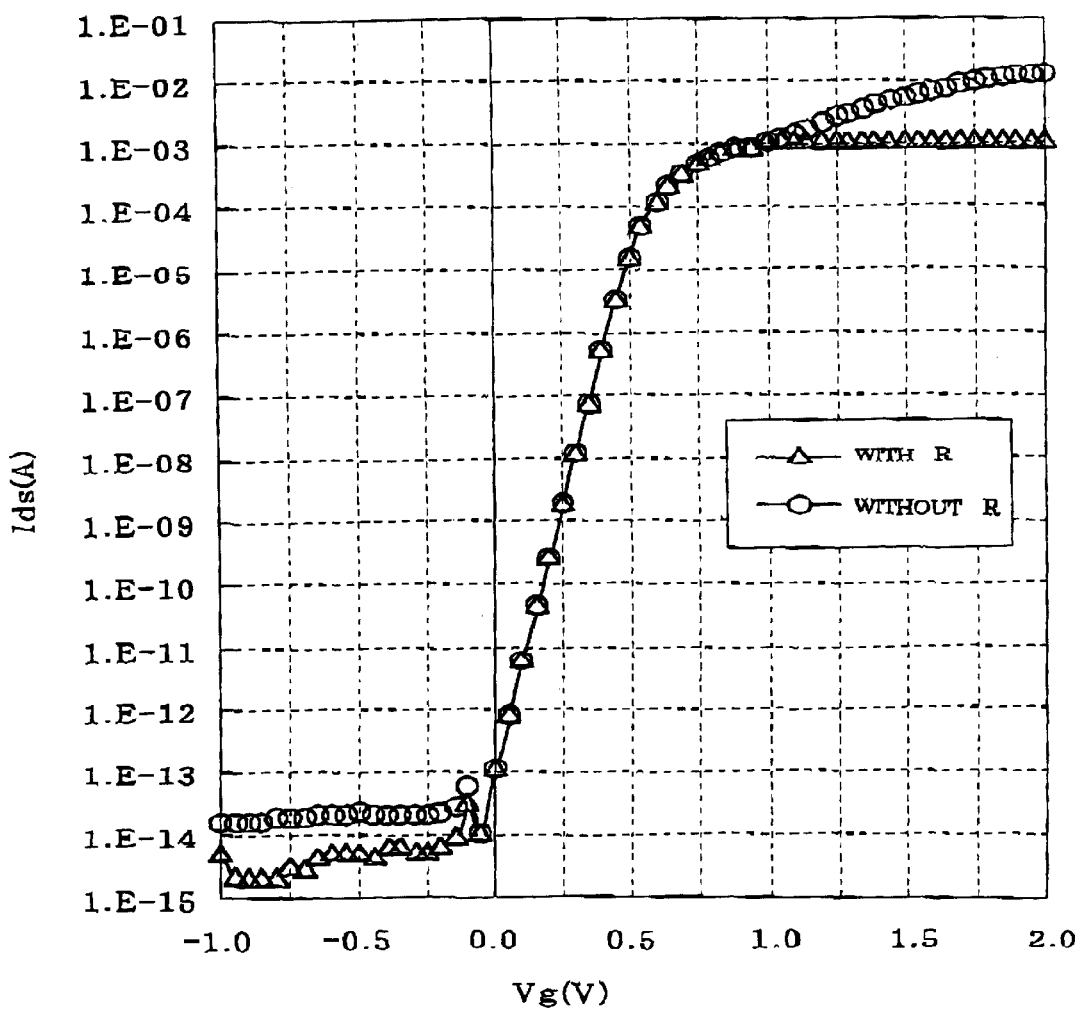
FIG. 59 is a comparative graph of the characteristics of a DTMOS type of field-effect transistor that is provided with a resistance portion R and a DTMOS type of field-effect transistor that is not provided with a resistance portion R.
Figure 60:
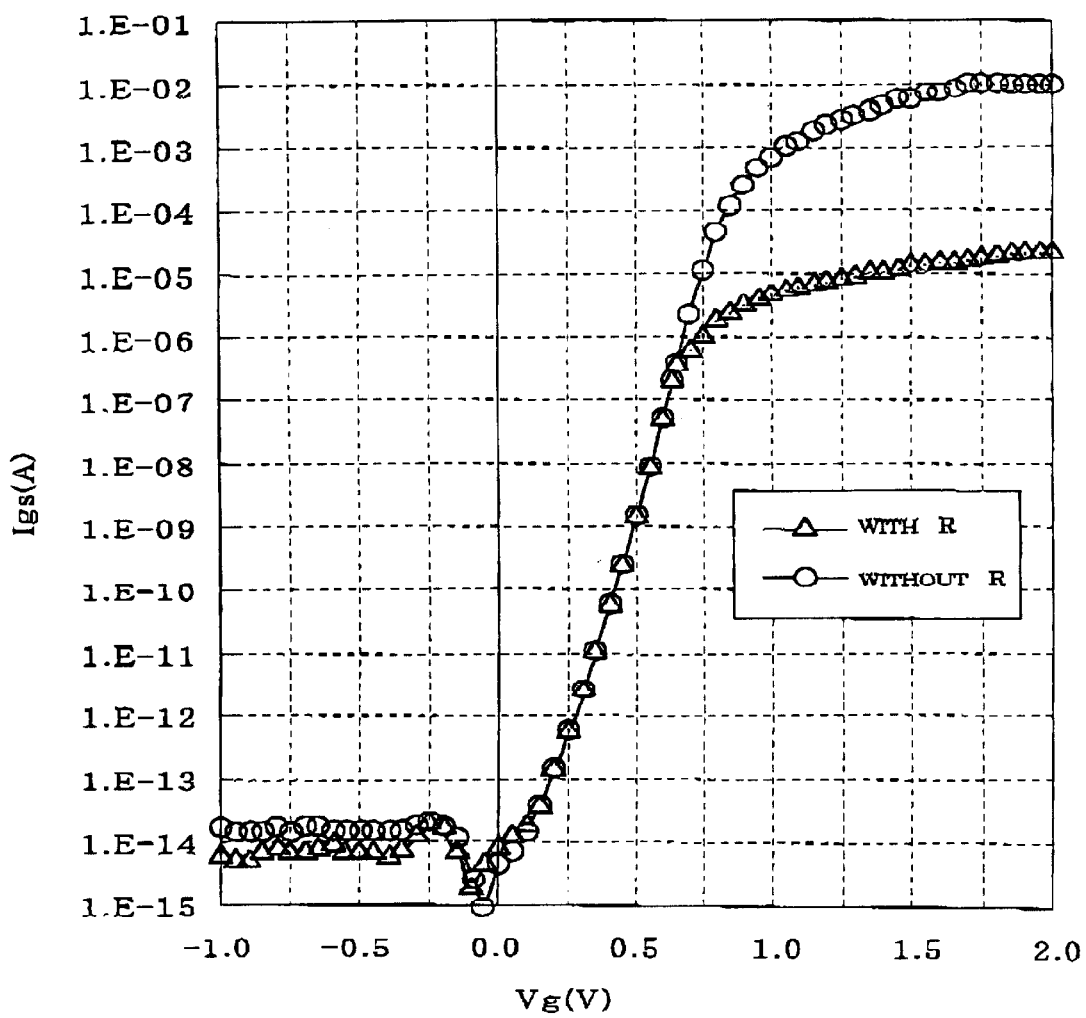
FIG. 60 is a graph of the relationship between the gate voltage Vg of a DTMOS type of field-effect transistor and the current Igs flowing from the gate electrode through the body region and into the source region.

A graph illustrating both a case in which the resistance portion R is present and another case in which the resistance portion R is not present is shown in FIG. 59. In other words, FIG. 59 shows only the part of the graph of FIG. 55 where the drain voltage (Vd) is 1.1 V. FIG. 59 also shows only the part of FIG. 57 where the drain voltage (Vd) is 1.1 V. It is clear from this graph that the current (Ids) of the DTMOS type of field-effect transistor with the resistance portion R is less than the current (Ids) of the DTMOS type of field-effect transistor without the resistance portion R when the gate voltage (Vg) is comparatively high (1.0 V or higher). The conditions are as follows:

Operating mode: Partially depleted
Thickness of body region: 175 nm
Element separation method: LOCOS
Width of gate electrode: 25 µm
Length of gate electrode: 0.6 µm As is clear from the graph, the current (Igs) is restrained in the DTMOS with the resistance portion R (56 kΩ), in comparison with the DTMOS without the resistance portion R, when the gate voltage (Vg) is comparatively high (0.7 to 0.8 V or higher). As described above, the current (Ids) can be held to a comparatively low magnitude in a DTMOS type of field-effect transistor in accordance with an embodiment of the present invention because the current (Igs) is restrained.

What is claimed is:

1. A field-effect transistor formed on a SOI substrate, said SOI-structure field-effect transistor comprising:
    a source region, a drain region, a body region, a gate electrode, a gate insulation film, and a resistance portion,
        wherein said body region is interposed between said source region and said drain region;
        wherein said gate electrode is formed on said body region, with said gate insulation film interposing therebetween;
        wherein said gate electrode and said body region are in electrical contact on one side of said gate electrode; and
        wherein said gate electrode and said resistance portion are in electrical contact on another side of said gate electrode.

2. The SOI-structure field-effect transistor as defined by claim 1, further comprising:
    an extended portion,
        wherein said extended portion is formed to extend from an end portion on said another side of said gate electrode; and
        wherein a part of said extended portion is employed as said resistance portion, by making the width of the part of said extended portion smaller than the width of a remaining part of said extended portion.

3. The SOI-structure field-effect transistor as defined by claim 1, further comprising:
    an extended portion,
        wherein said extended portion is formed to extend from an end portion on said other side of said gate electrode; and
        wherein a part of said extended portion is employed as said resistance portion, by making the impurity concentration in the part of said extended portion lower than the impurity concentration in a remaining part of said extended portion.

4. The SOI-structure field-effect transistor as defined by claim 1, further comprising:
    an extended portion,
        wherein said extended portion is formed to extend from an end portion on said other side of said gate electrode; and
        wherein a part of said extended portion is employed as said resistance portion, by configuring the part of said extended portion from a polysilicon film alone and forming a remaining part of said extended portion from a polysilicon film and a silicide film.

5. The SOI-structure field-effect transistor as defined by claim 1, further comprising:
    an extended portion,
        wherein said extended portion is formed to extend from an end portion on said other side of said gate electrode;
        wherein said extended portion includes a turning portion; and
        wherein said extended portion including said turning portion acts as said resistance portion.

6. The SOI-structure field-effect transistor as defined by claim 1,
   wherein the resistance of said resistance portion is greater than the on-resistance of said field-effect transistor.

7. The SOI-structure field-effect transistor as defined by claim 6,
   wherein the resistance of said resistance portion is at least ten times the on-resistance of said field-effect transistor.

8. The SOI-structure field-effect transistor as defined by claim 1,
   wherein said field-effect transistor is partially depleted.

9. The SOI-structure field-effect transistor as defined by claim 1,
   wherein said field-effect transistor is fully depleted.

10. The SOI-structure field-effect transistor as defined by claim 1, wherein said gate electrode is formed on a portion of said body region.

11. The SOI-structure field-effect transistor as defined by claim 1, wherein said resistance portion and said gate electrode comprise the same layer of material.

12. The SOI-structure field-effect transistor as defined by claim 1, further comprising a first gate interconnection in the second gate interconnection.

13. The SOI-structure field-effect transistor as defined by claim 1, wherein said resistance portion is formed over a field oxide film.

14. The SOI-structure field-effect transistor as defined by claim 1, wherein said body region comprises a first conductivity type region and a second conductivity type region, wherein said first conductivity type region has different conductivity than said second conductivity type region.

15. The SOI-structure field-effect transistor as defined by claim 1, wherein the SOI substrate comprises a silicon substrate, a buried oxide film, and a silicon layer, wherein the body region is formed in said silicon layer.

16. A MOS field-effect transistor formed on a SOI substrate, said MOS field-effect transistor comprising:
    a source region, a drain region, a body region, a gate electrode, a gate insulation film, a first contact portion, a second contact portion, and a resistance portion,
    wherein said body region is interposed between said source region and said drain region and includes a first end portion and a second end portion;
    wherein said gate electrode is formed on said body region, with said gate insulation film interposed therebetween, and extends in a direction from said first end portion toward said second end portion;
    wherein said first contact portion is formed on said first end portion side;
    wherein a gate signal interconnection for transferring a gate signal that is to be input to said gate electrode is connected electrically to said gate electrode via said first contact portion;
    wherein said second contact portion is formed on said second end portion side;
    wherein said gate electrode is connected electrically to said body region in said second contact portion;
    wherein said resistance portion is formed on said first end portion side; and
    wherein said gate electrode is connected electrically to said first contact portion through said resistance portion.

17. The SOI-structure MOS field-effect transistor as defined by claim 16,
    wherein said resistance portion is comprised within an interconnecting portion;
    wherein said interconnecting portion is formed on said first end portion side, and electrically connects said gate electrode and said first contact portion; and
    wherein a part of said interconnecting portion is utilized as said resistance portion, by making the width of the part of said interconnecting portion smaller than the width of a remaining part of said interconnecting portion.

18. The SOI-structure MOS field-effect transistor as defined by claim 16,
    wherein said resistance portion is comprised within an interconnecting portion;
    wherein said interconnecting portion comprises a polysilicon film;
    wherein said interconnecting portion is formed on said first end portion side, and electrically connects said gate electrode and said first contact portion; and
    wherein a part of said interconnecting portion is utilized as said resistance portion, by making the impurity concentration of the part of said interconnecting layer lower than the impurity concentration of a remaining part of said interconnecting layer.

19. The SOI-structure MOS field-effect transistor as defined by claim 16,
    wherein said resistance portion is comprised within an interconnecting portion;
    wherein said interconnecting portion is formed on said first end portion side, and electrically connects said gate electrode and said first contact portion; and
    wherein a part of said interconnecting portion is utilized as said resistance portion, by forming the part of said interconnecting portion from a polysilicon film alone and forming a remaining part of said interconnecting portion from a polysilicon film and a silicide film.

20. The SOI-structure MOS field-effect transistor as defined by claim 16,
    wherein said resistance portion is comprised within an interconnecting portion;
    wherein said interconnecting portion is formed on said first end portion side, and electrically connects said gate electrode and said first contact portion; and
    wherein a part of said interconnecting portion is utilized as said resistance portion by forming the length of said interconnecting portion is longer than a shortest distance between said first contact portion and said gate electrode.

21. The SOI-structure MOS field-effect transistor as defined by claim 20, comprising:
    an element isolation layer disposed in a manner to surround said source region and said drain region,
    wherein said interconnecting portion takes a circuitous path on a surface of said element isolation layer and is connected electrically to said first contact portion.

22. The SOI-structure MOS field-effect transistor as defined by claim 16,
    wherein the resistance of said resistance portion is greater than the on-resistance of said field-effect transistor.

23. The SOI-structure MOS field-effect transistor as defined by claim 22,
    wherein the resistance of said resistance portion is at least ten times the on-resistance of said field-effect transistor.

24. The SOI-structure MOS field-effect transistor as defined by claim 16,
    wherein said field-effect transistor is partially depleted.

25. The SOI-structure MOS field-effect transistor as defined by claim 16, wherein said field-effect transistor is fully depleted.

26. The SOI-structure field-effect transistor as defined by claim 16, wherein said gate electrode is formed on a portion of said body region.

27. The SOI-structure field-effect transistor as defined by claim 16, wherein said resistance portion and said gate electrode comprise the same layer of material.

28. The SOI-structure field-effect transistor as defined by claim 16, wherein said resistance portion is formed over a field oxide film.

29. The SOI-structure field-effect transistor as defined by claim 16, wherein said body region comprises a first conductivity type region and a second conductivity type region, wherein said first conductivity type region has different conductivity than said second conductivity type region.

30. The SOI-structure field-effect transistor as defined by claim 16, wherein the SOI substrate comprises a silicon substrate, a buried oxide film, and a silicon layer, wherein the body region is formed in said silicon layer.

\* \* \* \* \*